US012796368B2

(12) United States Patent
Ye et al.

(10) Patent No.: US 12,796,368 B2
(45) Date of Patent: Nov. 10, 2026

(54) DICING METHOD, BONDING METHOD AND DIE

(71) Applicant: WUHAN XINXIN SEMICONDUCTOR MANUFACTURING CO., LTD., Wuhan (CN)

(72) Inventors: Guoliang Ye, Wuhan (CN); Sheng Hu, Wuhan (CN); Qiong Zhan, Wuhan (CN); Jun Zhou, Wuhan (CN); Peng Sun, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 391 days.

(21) Appl. No.: 18/400,083

(22) Filed: Dec. 29, 2023

(65) Prior Publication Data

US 2024/0332079 A1 Oct. 3, 2024

(30) Foreign Application Priority Data

Mar. 31, 2023 (CN) ......................... 202310341516.1

(51) Int. Cl.
*H10P 54/00* (2026.01)

(52) U.S. Cl.
CPC .................................... *H10P 54/00* (2026.01)

(58) Field of Classification Search
CPC .......... H10P 54/00; H10P 54/20; H10P 54/30; H10P 54/40; H10P 54/50; H10P 54/92; H10P 54/922; H10P 58/00; H10P 58/20; H10P 58/22; H10P 10/00; H10P 10/12; H10P 10/126; H10P 10/128; H10P 10/14; H10P 54/52; H10P 34/42; H10P 72/7402; H10P 72/7428; H10P 90/1916; H10P 90/1924; H10P 95/112; H10W 29/00; H10W 29/01; H10W 72/547; H10W 90/00; H10W 90/756; H10W 90/752
USPC ....... 257/690, 621, 620, 618, 778, 723, 787, 257/737, 738, 685; 438/462, 113, 458, 438/460, 464, 108
See application file for complete search history.

(56) References Cited

U.S. PATENT DOCUMENTS

| | | | | |
|---|---|---|---|---|
| 8,236,611 | B1 * | 8/2012 | Anderson | H10P 54/00 438/460 |
| 2012/0161308 | A1 * | 6/2012 | Chu | H10F 39/804 257/E31.124 |
| 2019/0363020 | A1 * | 11/2019 | Seddon | B23K 26/53 |
| 2021/0125838 | A1 * | 4/2021 | Nakata | H10P 54/00 |
| 2022/0115426 | A1 * | 4/2022 | Son | H10F 39/804 |
| 2024/0079272 | A1 * | 3/2024 | Lee | H10P 54/00 |

* cited by examiner

*Primary Examiner* — Natalia A Gondarenko
(74) *Attorney, Agent, or Firm* — MUNCY, GEISSLER, OLDS & LOWE, P.C.

(57) ABSTRACT

A dicing method, a bonding method and a die are disclosed, in the die, a protective structure is formed, which at least covers a top surface of a functional layer, and substrate dicing is carried out along the thickness of dicing lanes. By protecting the top surface of the functional layer with the protective structure, contamination of a bonding interface by particles produced during the substrate dicing process can be minimized or prevented, increasing the quality and reliability.

20 Claims, 14 Drawing Sheets provide substrate including support layer and functional layer on support layer, functional layer defining device regions and dicing lanes, dicing lanes defining first openings — S10

↓ form protective structure at least covering top surface of functional layer — S11

↓ dice substrate along thickness of dicing lanes — S12

DICING METHOD, BONDING METHOD AND DIE

CROSS-REFERENCES TO RELATED APPLICATION

This application claims the priority of Chinese patent application number 202310341516.1, filed on Mar. 31, 2023, the entire contents of which are incorporated herein by reference.

TECHNICAL FIELD

The present invention relates to the field of semiconductor technology and, in particular, to a dicing method, a bonding method and a die.

BACKGROUND

The fabrication of semiconductor chips involves dicing a substrate into individual dies. Such dicing methods mainly include blade dicing, laser grooving, plasma dicing and laser stealth dicing. A dicing process tends to produce particles, which can easily adhere to a bonding interface, which is, however, highly intolerant to defects and particularly requires minimization or prevention of particle contamination. Therefore, for those skilled in the art, it would be desirable to address the challenge of minimizing or preventing contamination of a bonding interface by particles producing during a dicing process.

SUMMARY OF THE INVENTION

It is an objective of the present invention to provide a dicing method, a bonding method and a die, which can overcome the problem of easy contamination of a bonding interface by particles producing during a dicing process associated with the prior art.

To this end, the present invention provides a dicing method, including: providing a substrate including a support layer and a functional layer on the support layer, the functional layer defining device regions and dicing lanes, the dicing lanes defining first openings; forming a protective structure at least covering a top surface of the functional layer; and dicing the substrate along a thickness of the dicing lanes.

Optionally, in the dicing method, the functional layer and the support layer may define first steps after the substrate is diced.

Optionally, in the dicing method, the formation of the first openings may include performing an etching process on the dicing lanes to at least partially void the dicing lanes along the thickness so that a surface of the support layer is partially exposed.

Optionally, in the dicing method, the dicing lanes may include first dicing lanes and second dicing lanes between the first dicing lanes and the support layer, wherein the formation of the first openings includes: partially voiding the first dicing lanes, thereby forming sub-openings in the first dicing lanes; filling the sub-openings with the protective structure; and partially removing the protective structure from the sub-openings and partially voiding the second dicing lanes so that the surface of the support layer is partially exposed, thereby resulting in the formation of the first openings, which have a transverse dimension smaller than a transverse dimension of the sub-openings.

Optionally, in the dicing method, the second dicing lanes may at least contain a dielectric material and a conductive material within the dielectric material, wherein a laser grooving process is utilized to partially remove the protective structure from the sub-openings and partially void the second dicing lanes.

Optionally, in the dicing method, the functional layer may include a first functional sub-layer in the same layer as the first dicing lanes and a second functional sub-layer in the same layer as the second dicing lanes, wherein after the substrate is diced, the second functional sub-layer and the support layer define the first steps, and the first and second functional sub-layers define second steps.

Optionally, in the dicing method, the protective structure may be formed of a protective fluid for use in laser dicing.

Optionally, in the dicing method, the protective structure at least covering the top surface of the functional layer may also fill the first openings, wherein the dicing method further includes, before the substrate is diced along the thickness of the dicing lanes, providing the substrate on a carrier and forming second openings in the first openings, the formation of the second openings including partially removing the protective structure from the first openings so that the surface of the support layer is partially exposed, thereby resulting in the formation of the second openings, with the remainder of the protective structure in the first openings covering side walls of device regions, the second openings having a transverse dimension smaller than a transverse dimension of the first openings.

Optionally, in the dicing method, dicing the substrate along the thickness of the dicing lanes may include removing at least a partial thickness of the support layer between the second openings and the carrier along the thickness of the dicing lanes from the side of the protective structure, wherein the dicing method further includes, after the substrate is diced along the thickness of the dicing lanes, removing the protective structure.

Optionally, in the dicing method, dicing the substrate along the thickness of the dicing lanes may include: removing at least a partial thickness of the support layer between the second openings and the carrier along the thickness of the dicing lanes from the side of the protective structure, the removal stopping within the support layer, thereby resulting in the formation of grooves in the support layer; and from the side of the support layer, dicing the substrate by breaking the support layer along the grooves with a pin and/or through stretching the carrier.

Optionally, in the dicing method, the substrate may be a wafer, wherein the support layer is a silicon substrate, and wherein the substrate is diced into dies.

Optionally, in the dicing method, the protective structure at least covering the top surface of the functional layer may be a semiconductor substrate, wherein dicing the substrate along the thickness of the dicing lanes includes cutting through the support layer along the thickness of the dicing lanes from the side of the support layer, thereby dicing the substrate into individual dies; and the dicing method further includes, after the substrate is diced along the thickness of the dicing lanes, removing the protective structure.

The present invention also provides a die obtained according to the dicing method as defined above, the die including a support layer and a functional layer on the support layer, the functional layer including a device region, the functional layer and the support layer defining first steps.

Optionally, in the die, the functional layer may include a second functional sub-layer on the support layer and a first functional sub-layer on the second functional sub-layer, the first functional sub-layer and the second functional sub-layer defining second steps.

The present invention also provides a bonding method, including: forming a die according to the dicing method as defined above; and bonding a functional layer of the die to a semiconductor structure, wherein the semiconductor structure is another substrate or another die.

In the dicing method, the bonding method and the die provided in the present invention, after the protective structure at least covering the top surface of the functional layer is formed, the substrate is diced along the thickness of dicing lanes. With the protective structure protecting the top surface of the functional layer, contamination of the bonding interface by particles produced during the substrate dicing process can be minimized or prevented, increasing the quality and reliability of the bonding interface.

Figures 1, 2A:
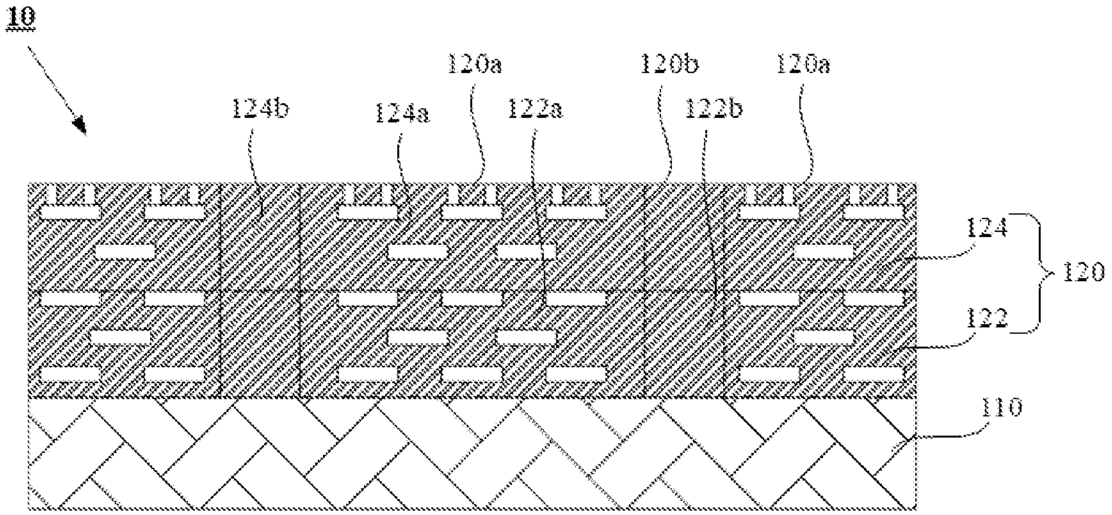
FIG. 1 is a schematic flowchart of a dicing method according to an embodiment of the present invention.
FIG. 2*a* is a schematic diagram showing the structure of a substrate provided in a dicing method according to an embodiment of the present invention taken perpendicular to a surface of the substrate.

- 10—substrate; 12—die; 14—semiconductor structure; 110—support layer; 1100—first step; 120—functional layer; 120*a*—device region; 120*b*—dicing lane; 120*c*—first opening; 120*d*—second opening; 122—second functional sub-layer; 122*a*—second device region; 122*b*—second dicing lane; 124—first functional sub-layer; 124*a*—first device region; 124*b*—first dicing lane; 1240*b*—dielectric region; 130—protective structure; 140—carrier; 150—groove; 160—protective structure;
- 20—substrate; 22—die; 210—support layer; 2100—first step; 220—functional layer; 220*a*—device region; 220*b*—dicing lane; 220*c*—first opening; 220*d*—sub-opening; 220*e*—second opening; 222—second functional sub-layer; 2220—second step; 222*a*—second device region; 222*b*—second dicing lane; 224—first functional sub-layer; 224*a*—first device region; 224*b*—first dicing lane; 230—protective structure; 240—carrier; 250—groove; 260—protective structure.

DETAILED DESCRIPTION

Dicing methods, bonding methods and dies provided therein will be described in greater detail below with reference to specific embodiments and to the accompanying drawings. Advantages and features of the present invention will become more apparent from the following description and from the appended claims. Note that the drawings are provided in a very simplified form not necessarily drawn to exact scale for the only purpose of facilitating easy and clear description of the disclosed embodiments.

The terminology used herein is used for the purpose of describing particular embodiments only, and is not intended to limit the scope of the present invention. Unless defined otherwise herein, all technical and scientific terms used herein have the same meaning as commonly understood by one of ordinary skill in the art to which the invention belongs. As used herein and in the appended claims, the terms “first,” “second,” and the like do not denote any order, quantity, or importance, but rather are used to distinguish one element from another. Likewise, the terms “a” and “an” do not denote a limitation of quantity, but rather denote the presence of at least one of the referenced items. The terms “plurality” or “several” means two or more than two. The terms “front”, “rear”, “upper”, “lower”, “upper” and/or the like used herein are merely for ease of description, and should not be construed as being limited to a particular position or a particular spatial orientation. The use of “including” or “including” or the like herein is meant to encompass the items listed thereafter and equivalents thereof but do not preclude the presence of other items. The terms “connected”, “coupled” or the like are not restricted to physical or mechanical connections or couplings, and can include electrical connections or couplings, whether direct or indirect. As used herein and in the appended claims, the singular forms “a”, “an”, and “the” are intended to include the plural forms as well, unless the context clearly indicates otherwise. It will be also understood that, as used herein, the term “and/or” includes any and all combinations of one or more of the associated listed items.

In principle, the present invention seeks to provide a dicing method, a bonding method and a die, in which a protective structure is formed, which at least covers a top surface of a functional layer, and substrate dicing is carried out along the thickness of dicing lanes. By protecting the top surface of the functional layer with the protective structure, contamination of a bonding interface by particles produced during the substrate dicing process can be minimized or prevented, increasing the quality and reliability of the bonding interface.

Specifically, reference is made to FIG. 1, a schematic flowchart of a dicing method according to an embodiment of the present invention. As shown in FIG. 1, the dicing method includes the steps of:

Step S10: providing a substrate including a support layer and a functional layer lying on the support layer, the functional layer defining device regions and dicing lanes, the dicing lanes defining first openings;

Step S11: forming a protective structure, which at least covers a top surface of the functional layer; and Step S12: dicing the substrate along the thickness of the dicing lanes.

Optionally, examples of the substrate may include, but are not limited to, semiconductor substrates, glass substrates and ceramic substrates. Examples of the semiconductor substrates may include, but are not limited to, silicon (Si) substrates, germanium (Ge) substrates, silicon-germanium (SiGe) substrates, silicon-on-insulator (SOI) substrates and germanium-on-insulator (GOI) substrates. Other examples of the semiconductor substrates may include substrates of other elements and components, such as GaAs, InP and SiC. Still other examples of the semiconductor substrates may include stacked substrates, such as Si/SiGe substrates. Still yet other examples of the semiconductor substrates may include epitaxial substrates, such as SiGe-on-insulator (SGOI) substrates. The embodiments disclosed herein are exemplified in the context of the substrate being implemented as a wafer to be diced into individual dies.

Dicing methods, bonding methods and dies provided therein will be described in greater detail below by way of a few examples.

Embodiment 1

Reference is made to FIGS. 2*a*, 2*b* and 3 to 7, which are schematic illustrations of intermediate structures formed in a dicing method according to an embodiment of the present invention.

Figure 2B:
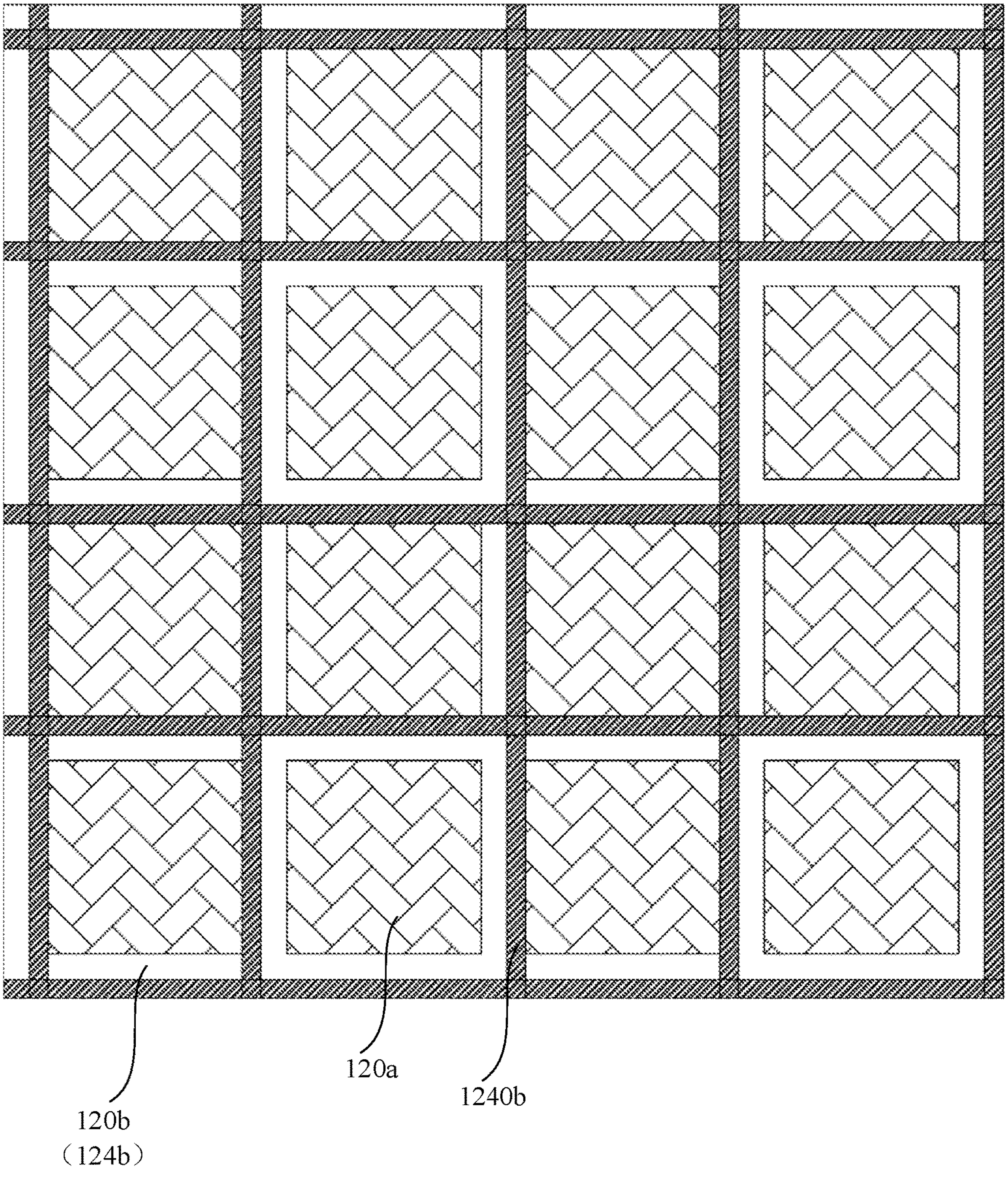
FIG. 2*b* is a schematic diagram showing the structure of a substrate provided in a dicing method according to an embodiment of the present invention taken parallel to a surface of the substrate.

As shown in FIG. 2*a*, a substrate 10 is provided, the substrate 10 includes a support layer 110 and a functional layer 120 overlying the support layer 110. The functional layer 120 defines device regions 120*a* and dicing lanes 120*b*. Reference is again made to FIG. 2*a*, which is a schematic cross-sectional view taken perpendicular to a surface of the substrate 10. FIG. 2*a* schematically shows two of the dicing lanes 120*b* extending in the same direction. In the embodiments disclosed herein, the support layer 110 may be a silicon substrate. Reference is made to FIG. 2*b*, a schematic cross-sectional view taken parallel to the surface of the substrate 10. The dicing lanes 120*b* may include a plurality of dicing lanes extending in a first direction and another plurality of dicing lanes extending in a second direction, the second direction is perpendicular to the first direction in the cross-sectional plane parallel to the surface of the substrate 10. The dicing lanes extending in the first and second directions define a plurality of device regions 120*a* corresponding to a plurality of dies to be formed using the dicing process. The functional layer 120 includes a second functional sub-layer 122 and a first functional sub-layer 124, the second functional sub-layer 122 lies on the support layer 110 and the first functional sub-layer 124 lies on the second functional sub-layer 122. In other embodiments, the functional layer 120 may be either a single layer or a composite layer consisting of two or more sub-layers. Accordingly, the second functional sub-layer 122 defines second device regions 122*a* and second dicing lanes 122*b*, and the first functional sub-layer 124 defines first device regions 124*a* and first dicing lanes 124*b*. In the embodiments disclosed herein, the second device regions 122*a* and/or the first device regions 124*a* may include a dielectric material (not shown) and/or a conductive material (not shown) within the dielectric material. These materials can impart different electrical functions. The second dicing lanes 122*b* and/or the first dicing lanes 124*b* may include a dielectric material and/or a conductive material within the dielectric material. Furthermore, the second functional sub-layer 122 and the first functional sub-layer 124 may be formed using the same or different processes on the same or different semiconductor equipment deployed at the same or different locations, without departing from the scope of the present application. As shown in FIG. 2*b*, in one embodiment of this application, the second dicing lanes 122*b* include a dielectric material and a conductive material within the dielectric material. In this case, the formation of the first functional sub-layer 124 on the second functional sub-layer 122 may involve forming dielectric regions 1240*b* not containing the conductive material (i.e., region containing the dielectric material only) in the first dicing lanes 124*b* by using a predetermined pattern. The dielectric regions 1240*b* may be located around the middles or edges of the first dicing lanes 124*b*, or surround edges of the first device regions 124*a*.

Figure 3:
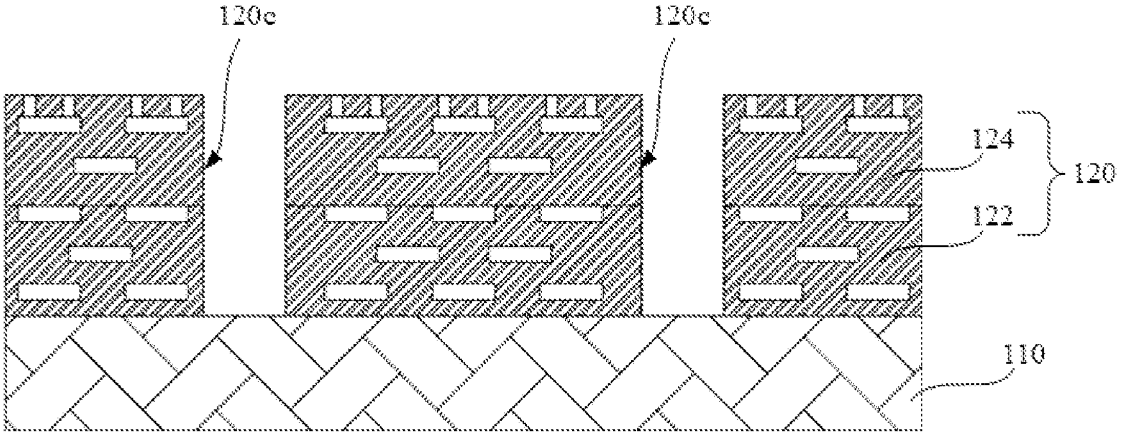
FIG. 3 is a schematic diagram showing the structure of first openings formed by voiding dicing lanes using an etching process in a dicing method according to an embodiment of the present invention.

Next, reference is made to FIG. 3, the dicing lanes 120*b* define first openings 120*c*, which extend from a top surface of the functional layer 120 to a bottom surface of the functional layer 120 and expose portions of a top surface of the support layer 110. The first openings 120*c* may be formed using a method including performing an etching process on the dicing lanes 120*b*. In the embodiments disclosed herein, the dicing lanes 120*b* are entirely dielectric, and the etching process may be performed on at least part of the dicing lanes 120*b* and proceed along the thickness thereof so that the surface portions of the support layer 110 are exposed. In a widthwise direction of the dicing lanes 120*b* parallel to the surface of the substrate 10, the dicing lanes 120*b* may be entirely or partially voided. That is, the first openings 120*c* have a transverse dimension smaller than or equal to a transverse dimension of the dicing lanes 120*b*. Preferably, the dicing lanes 120*b* are entirely emptied using a dry or wet etching process, i.e., all the dielectric material in the dicing lanes 120*b* is removed, resulting in the formation of the first openings 120*c*. This allows the resulting dies to have a reduced size.

During the etching process for voiding the dicing lanes 120*b*, substantially no particles are produced. Accordingly, in this process, even without the protection by a photoresist layer, particle contamination will substantially not occur to the exposed surface (i.e., the bonding interface in the subsequent bonding process) or side walls of the functional layer 120. Preferably, during the process for voiding the dicing lanes 120*b* and thereby forming the first openings 120*c*, the surface of the functional layer 120, especially the surface of the device regions 120*a*, is covered with a photoresist layer, which can enhance protection for the functional layer 120. Of course, in alternative embodiments, blade dicing, laser grooving, laser stealth dicing or the like may be employed, without departing from the scope of this application.

Figure 4:
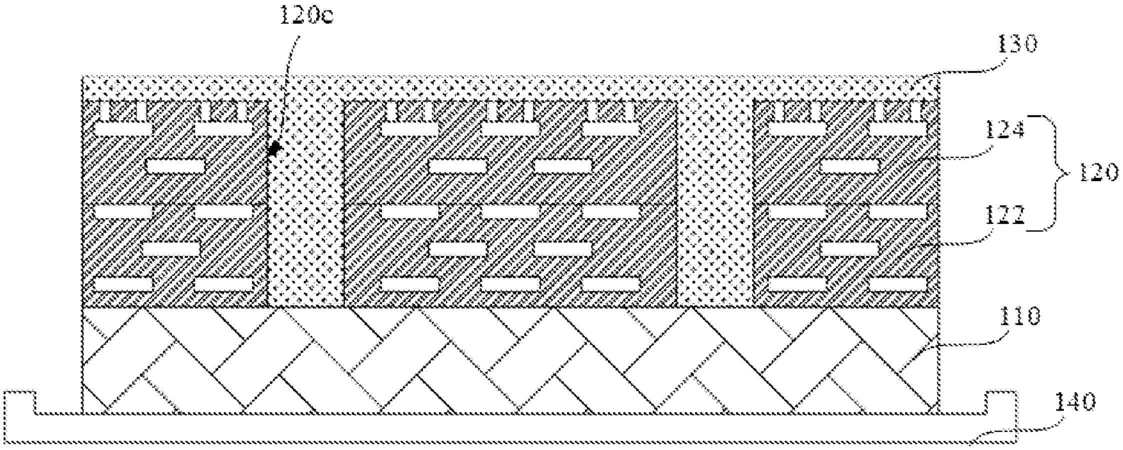
FIG. 4 is a schematic diagram showing the structure of a protective structure formed in a dicing method according to an embodiment of the present invention.

Subsequently, as shown in FIG. 4, a protective structure 130 is formed, which at least covers the top surface of the functional layer 120. In the embodiments disclosed herein, the protective structure 130 is formed of a protective fluid for use in laser dicing and may fill the first openings 120*c*. The protective structure 130 has a flat and smooth surface. Specifically, the protective fluid may be formed through a spin-coating process. The protective fluid may be implemented as any suitable product known in the art. For example, the protective fluid may at least contain an organic solvent.

With continued reference to FIG. 4, in the embodiments disclosed herein, the substrate 10 is placed on a carrier 140, and second openings 120*d* are formed in the first openings 120*c*. It is to be noted that the placement of the substrate 10 on the carrier 140 and the formation of the second openings 120*d* in the first openings 120*c* are not limited to being performed in any particular order. Preferably, the substrate 10 may be placed on the carrier 140 before the second openings 120*d* are formed in the first openings 120*c*. Optionally, the carrier 140 may be a dicing tape. Specifically, the dicing tape 140 may be adhesive, and the substrate 10 may be attached thereto. More specifically, the support layer 110 may be attached to the dicing tape 140. This allows for easier retention of the subsequent separate individual dies. The dicing tape 140 may be supported on a rigid frame and can provide sufficient support to the substrate 10. The dicing tape 140 may be, but is not limited to being, formed of a carbon-containing polymeric material.

Figure 5:
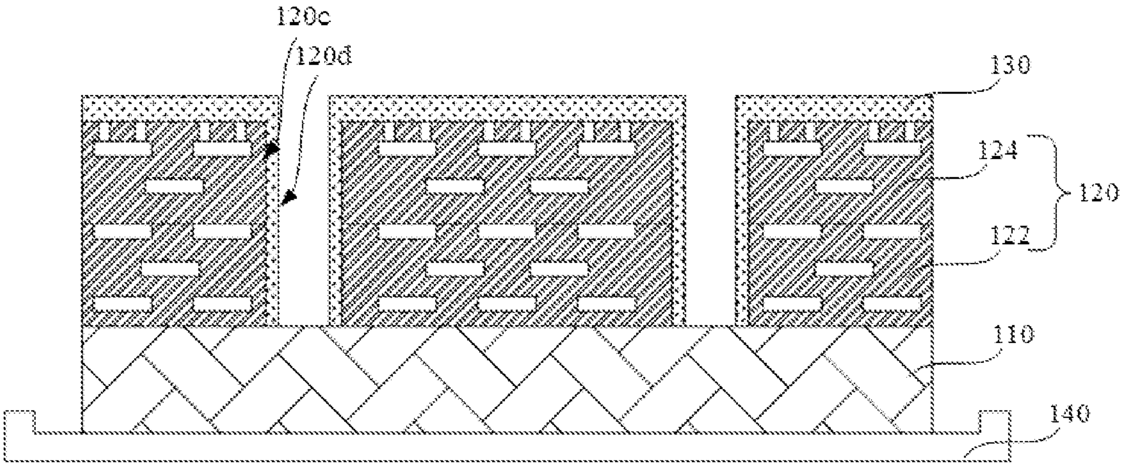
FIG. 5 is a schematic diagram showing a structure resulting from partial removal of a protective structure from dicing lanes in a dicing method according to an embodiment of the present invention.

As shown in FIG. 5, in the embodiments disclosed herein, the formation of the second openings 120*d* may in particular include: partially removing the protective structure 130 in the first openings 120*c* from the side of the protective structure 130 (i.e., the top side in the orientation of FIG. 5) so that the surface of the support layer 110 is partially exposed, thereby forming the second openings 120*d*. In this way, the protective structure 130 partially remains in the dicing lanes 120*b* and covers side walls of the device regions 120*a*, and the second openings 120*d* have a transverse dimension smaller than that of the first openings 120*c*.

Preferably, the partial removal of the protective structure 130 in the first openings 120*c* defined by the dicing lanes 120*b* may be accomplished with a laser grooving process. Partially removing the protective fluid using a laser grooving process is advantageous in dispensing with development and photolithography steps, when compared with using photoresist as the protective structure. Moreover, compared with using an inorganic dielectric material as the protective structure, it can dispense with growing the inorganic dielectric material at a high temperature, which may cause damage to the carrier. Thus, the generation of particles can be prevented or minimized particles. Further, with the protective structure 130 covering the top and side surfaces of the functional layer 120, i.e., protecting the bonding interface, contamination of the bonding interface will not happen even when a small amount of particles are produced.

Figure 6:
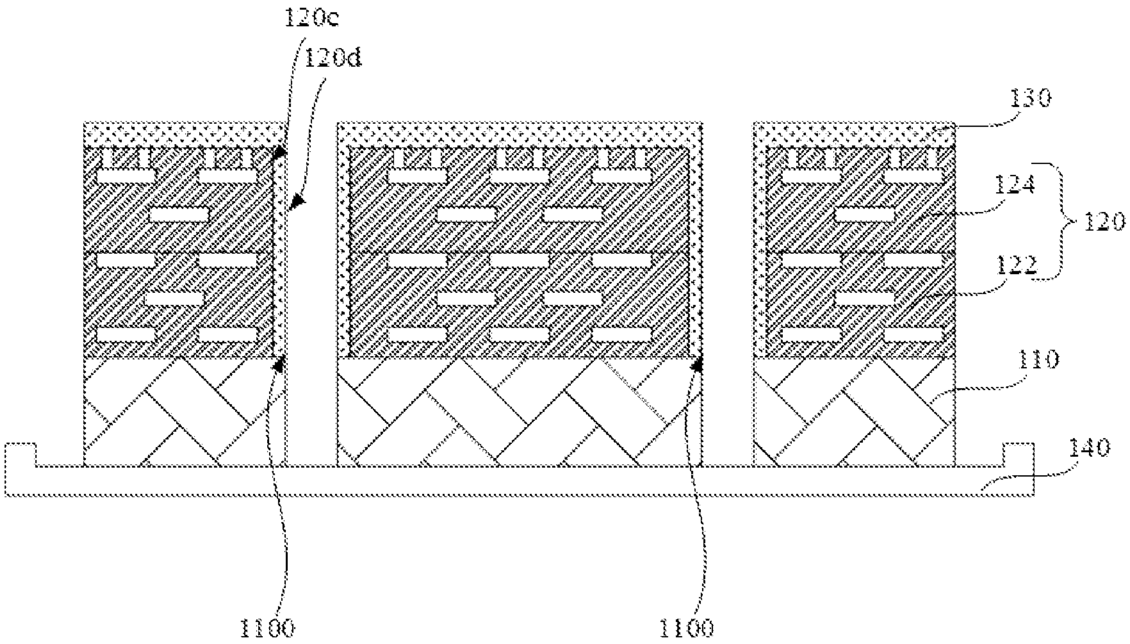
FIG. 6 is a schematic diagram showing a structure resulting from cutting a support layer in a dicing method according to an embodiment of the present invention.

Next, as shown in FIG. 6, the support layer 110 between the second openings 120*d* and the carrier 140 is at least partially removed along the thickness of the dicing lanes 120*b* (i.e., in the direction perpendicular to the surface of the substrate 10 as viewed in the orientation of FIG. 6) from the side of the protective structure 130 (i.e., the top side in the orientation of FIG. 6), forming individual separate dies. Specifically, in the embodiments disclosed herein, the support layer 110 exposed in the second openings of the dicing lanes 120*b* is gradually cut until a surface of the underlying carrier 140 is exposed. Preferably, the support layer 110 is cut using a plasma dicing process. Likewise, with the protective structure 130 protecting the bonding interface and side surfaces of the functional layer 120, contamination of the bonding interface and the side walls by particles produced in the process can be minimized or prevented, increasing the quality and reliability of the bonding interface. In alternative embodiments of this application, the support layer 110 may be cut by means of blade dicing, laser grooving, laser stealth dicing or the like.

Since the part of the protective structure 130 that remains in the dicing lanes 120*b* covers the side walls of the device regions 120*a*, in the direction of the extension of the support layer 110 (i.e., the direction parallel to the surface of the substrate 10 in the orientation of FIG. 6), the support layer 110 extends beyond the functional layer 120. Therefore, first steps 1100 form between the support layer 110 and the functional layer 120 after the substrate is diced.

Figure 7:
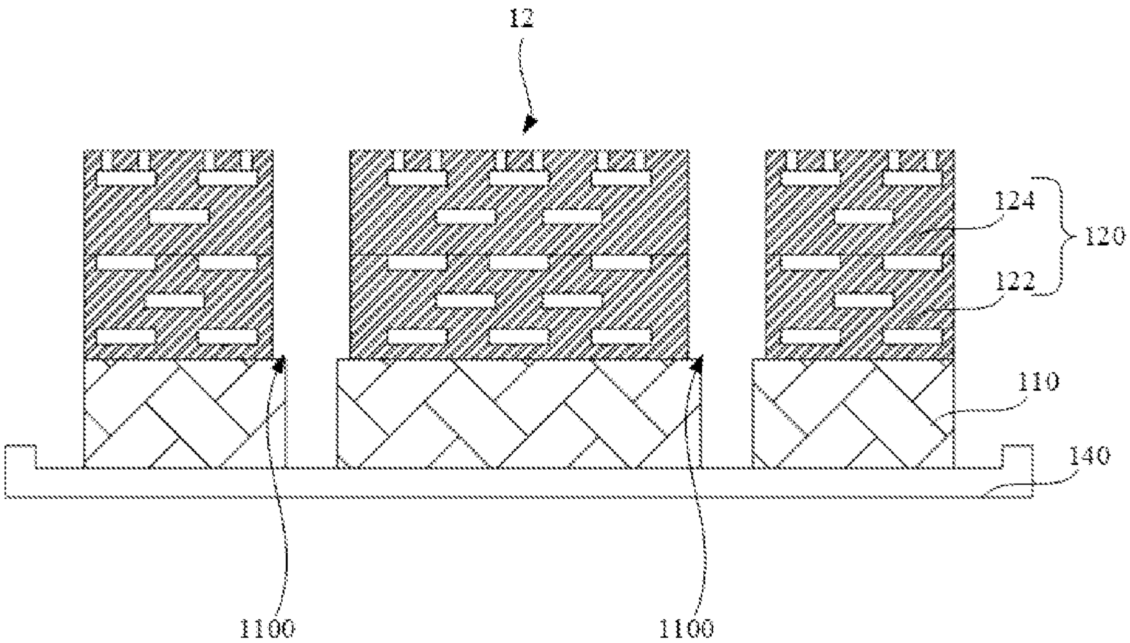
FIG. 7 is a schematic diagram showing a structure resulting from removal of a protective structure in a dicing method according to an embodiment of the present invention.

Afterwards, as shown in FIG. 7, the protective structure 130 is removed, exposing the bonding interface and the first steps 1100. Specifically, a wet etching process may be utilized to remove the protective structure 130. Additionally, the exposed surface may be cleaned to increase the quality and reliability of the separate dies.

Figure 8:
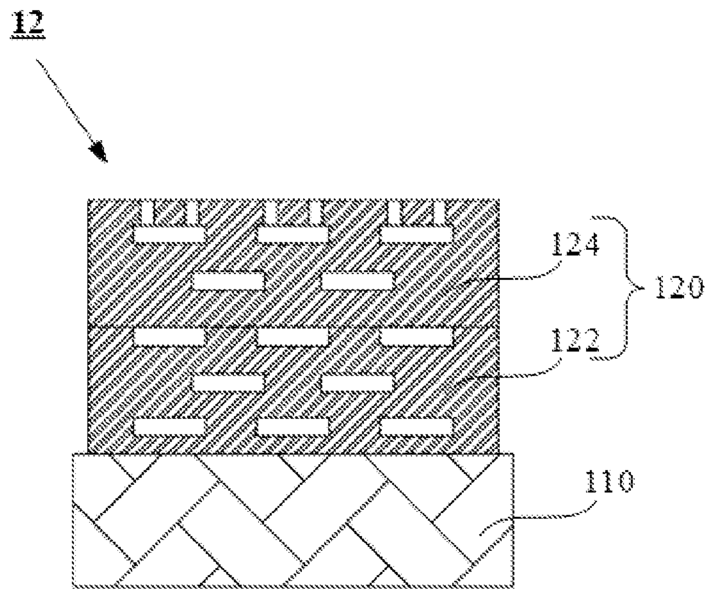
FIG. 8 is a schematic diagram showing the structure of an individual die according to an embodiment of the present invention.

FIG. 8 shows an individual die according to an embodiment of the present invention. As shown in FIG. 8, in conjunction with FIGS. 2 to 7, the die 12 includes a support layer 110 and a functional layer 120 lying on the support layer 110. The functional layer 120 includes a device region 120*a*. A surface of the support layer 110 is partially exposed from the functional layer 120, and the support layer 110 and the functional layer 120 define first steps 1100 therebetween.

Figure 9:
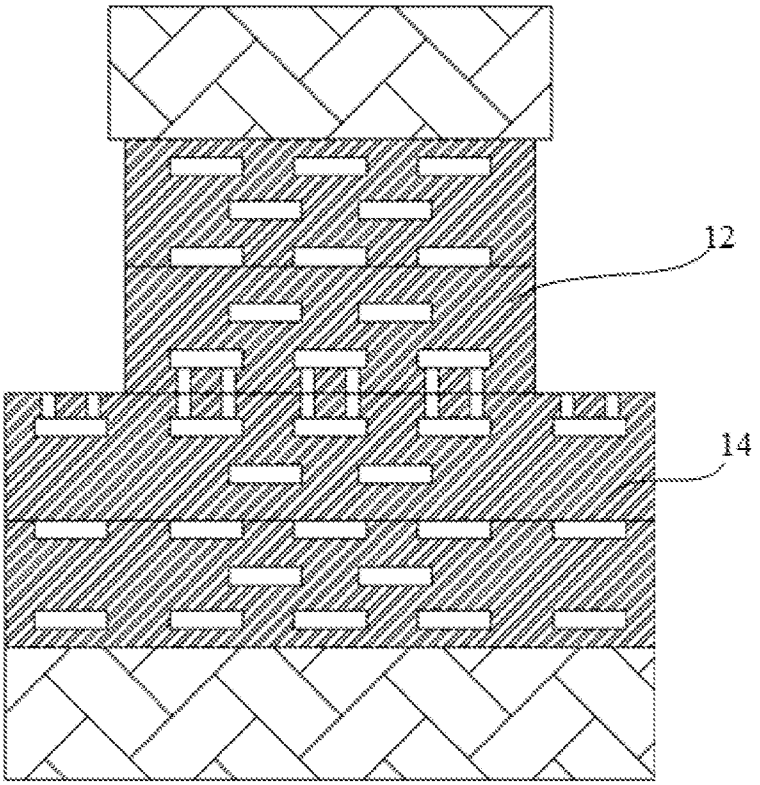
FIG. 9 is a schematic diagram showing a structure obtained by bonding a die to another semiconductor structure according to an embodiment of the present invention.

Further, the die 12 may be bonded to another semiconductor structure 14. FIG. 9 shows that the functional layer of the die 12 is bonded to a semiconductor structure 14. The semiconductor structure 14 may be another substrate, another die or the like. Specifically, the die 12 may be bonded to the semiconductor structure 14 using another known bonding technique. Since the die 12 has a high-quality, high-reliability bonding interface, the structure formed by it and the semiconductor structure 14 being bonded thereto also have increased quality and reliability.

Embodiment 2

Embodiment 2 differs from Embodiment 1 in that the support layer is diced in a different manner. In step S10, a substrate is provided, which includes a support layer and a functional layer lying on the support layer. The functional layer defines device regions and dicing lanes, and the dicing lanes define first openings. In step S11, a protective structure is formed, which at least covers a top surface of the functional layer. Reference can be made to the above description in connection with FIGS. 2 to 5 and Embodiment 1 for more details in this regard, and further description thereof is omitted in Embodiment 2.

As shown in FIG. 5, in the embodiments disclosed herein, the protective structure 130 in the dicing lanes 120*b* is partially removed from the side of the protective structure 130 (i.e., the top side in the orientation of FIG. 5) so that a surface of the support layer 110 is partially exposed. Next, referring to FIG. 10, at least a partial thickness of the support layer 110 between the second openings 120*d* and the carrier 140 is removed along the thickness of the dicing lanes 120*b* (i.e., in the direction perpendicular to the surface of the substrate 10 as viewed in the orientation of FIG. 10) from the side of the protective structure 130 (i.e., the top side in the orientation of FIG. 10). That is, the removal may stop within the support layer, or proceed through the entire support layer 110 (i.e., dice the substrate 10 into individual dies). In the former case, grooves 150 will be formed in the support layer 110. These grooves 150 may have any cross-sectional shape taken perpendicular to the surface of the functional layer 120.

Figure 10:
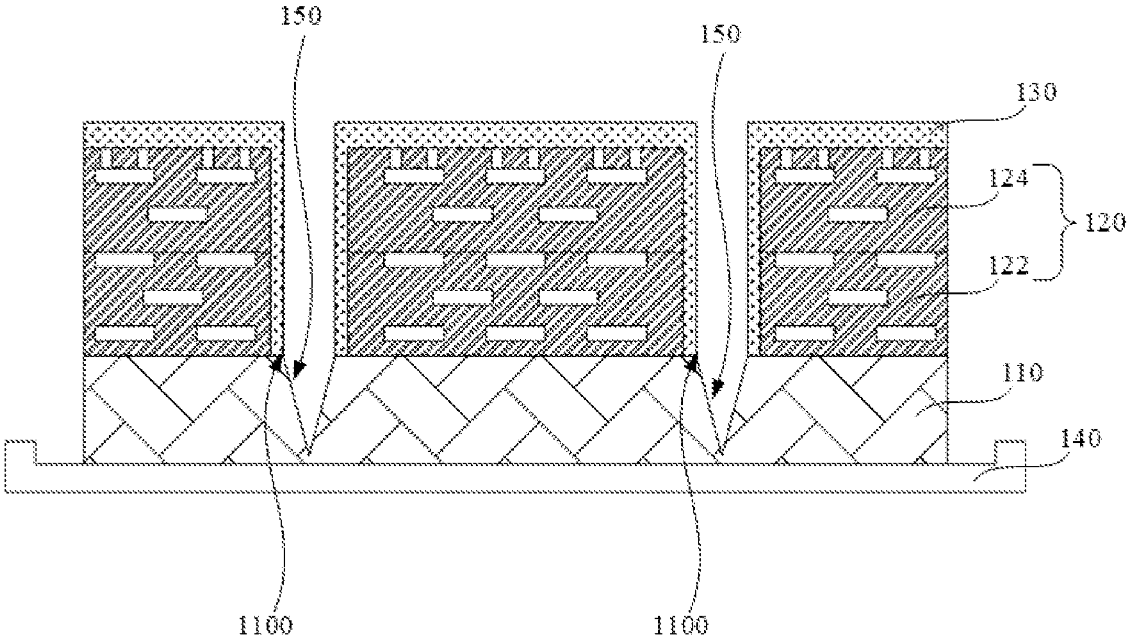
FIG. 10 is a schematic diagram showing a structure resulting from dicing a support layer in a dicing method according to an embodiment of the present invention.

As shown in FIG. 10, in the embodiments disclosed herein, a plasma dicing process may be employed to remove a partial thickness of the support layer 110, which may account for preferably 50% or more, and more preferably 80% to 95%, of a total thickness of the support layer 110. As illustrated, the grooves 150 are V-shaped grooves having slanted side walls and a sharp bottom.

Figure 11:
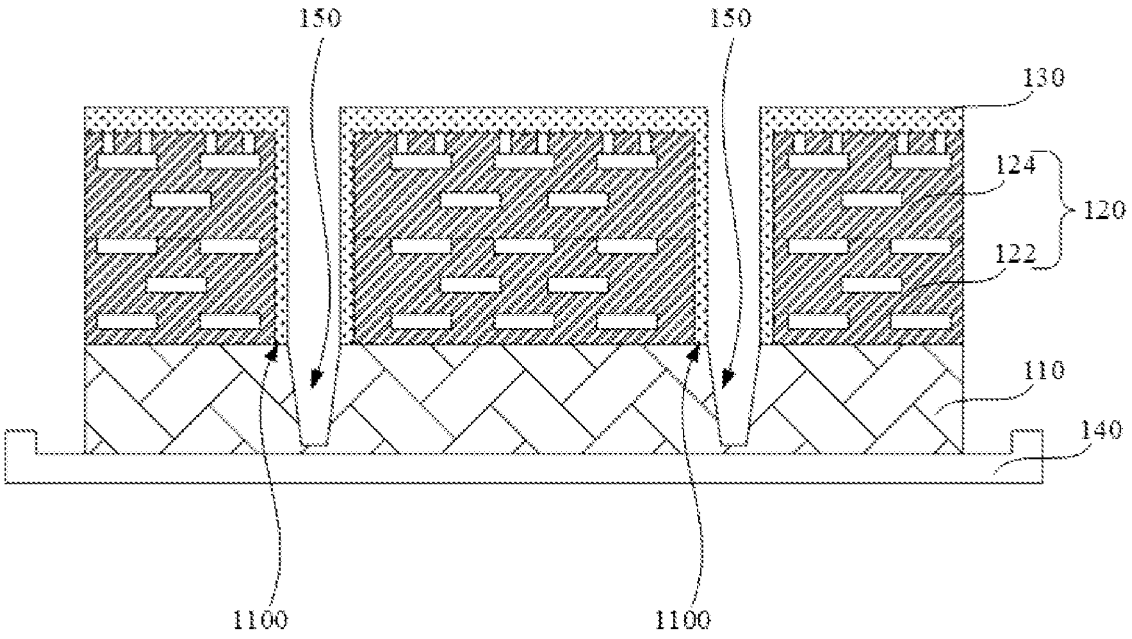
FIG. 11 is a schematic diagram showing a structure resulting from dicing a support layer in a dicing method according to an alternative embodiment of the present invention.

Referring to FIG. 11, in an alternative embodiment of this application, a laser grooving process may be employed to remove a partial thickness of the support layer 110, which may account for preferably 50% or more, and more preferably 80% to 95%, of the total thickness of the support layer 110. In this case, the grooves 150 may be inverted trapezoid-shaped grooves having slanted side walls and a flat bottom, as well as an opening size greater than their bottom size.

Figure 12:
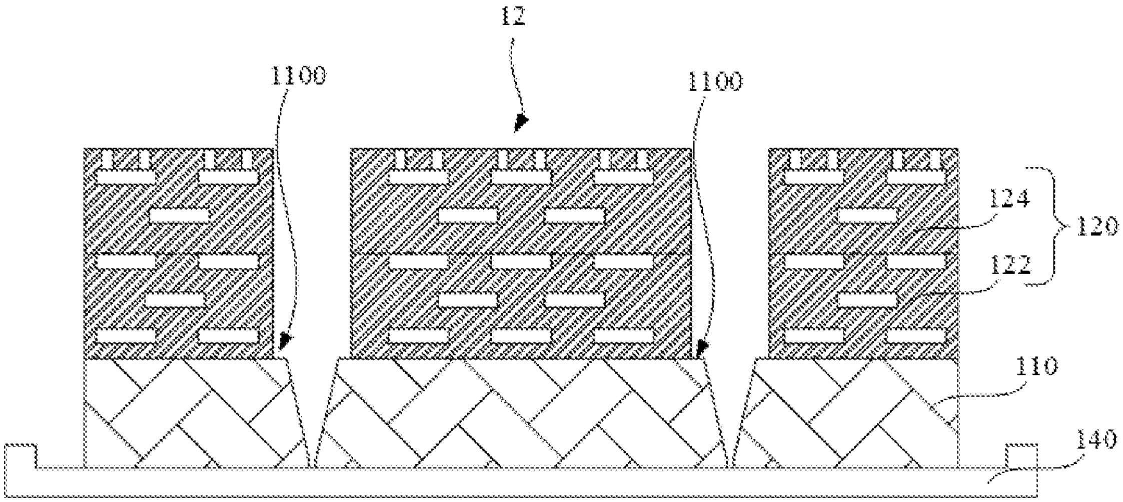
FIG. 12 is a schematic diagram showing a structure resulting from cutting through a support layer in a dicing method according to an embodiment of the present invention.

Referring to FIG. 12, in case of the support layer not being cut through, the substrate 10 may be diced into individual dies by breaking the support layer 110 along the grooves 150 from the side of the support layer 110 (i.e., the bottom side in the orientation of FIG. 12) with a pin and/or through stretching the carrier 140. In the embodiments disclosed herein, the carrier 140 may be a dicing tape, and the support layer 110 may be attached to the dicing tape 140. In particular, the dicing tape 140 may be an adhesive tape with a certain degree of flexibility. Preferably, a pin may be used to poke the support layer 110 and thereby break it apart. Similarly, with the protective structure 130 protecting the bonding interface and side surfaces of the functional layer 120, contamination of the bonding interface by particles can be minimized or prevented, increasing the quality and reliability of the bonding interface.

With continued reference to FIG. 12, the protective structure 130 is then removed, exposing the bonding interfaces and the first steps 1100. Each resulting individual die may be bonded to another semiconductor structure. Reference can be made to the above description in connection with FIGS. 8 to 9 and Embodiment 1 for more details in this regard, and further description thereof is omitted herein.

Embodiment 3

Embodiment 3 differs from Embodiment 1 in that the protective structure is a semiconductor substrate. In step S10, a substrate is provided, which includes a support layer and a functional layer lying on the support layer. The functional layer defines device regions and dicing lanes, and the dicing lanes define first openings. Reference can be made to the above description in connection with FIGS. 2 to 3 and Embodiment 1 for more details in this regard, and further description thereof is omitted in Embodiment 3.

Figure 13:
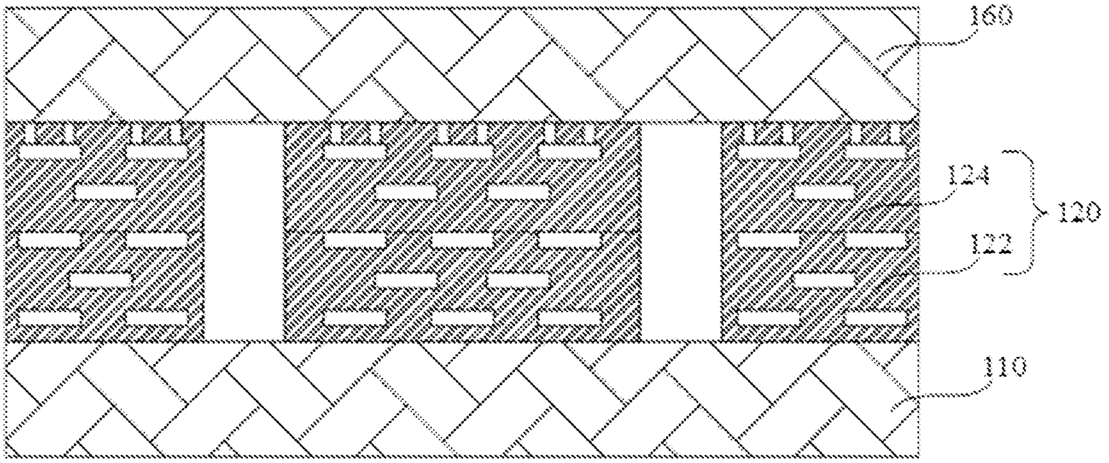
FIG. 13 is a schematic diagram showing a structure resulting from the formation of a protective structure in a dicing method according to an embodiment of the present invention.

As shown in FIG. 3, an etching process is performed on the dicing lanes 120*b* and proceeds along the thickness thereof, thereby voiding the entire dicing lanes 120*b* and partially exposing the surface of the support layer 110. Next, as shown in FIG. 13, a protective structure 160 is performed over the top surface of the functional layer 120. Here, the protective structure 160 is a semiconductor substrate. Specifically, the protective structure 160 may be formed on the functional layer 120 using a temporary bonding process.

Figure 14:
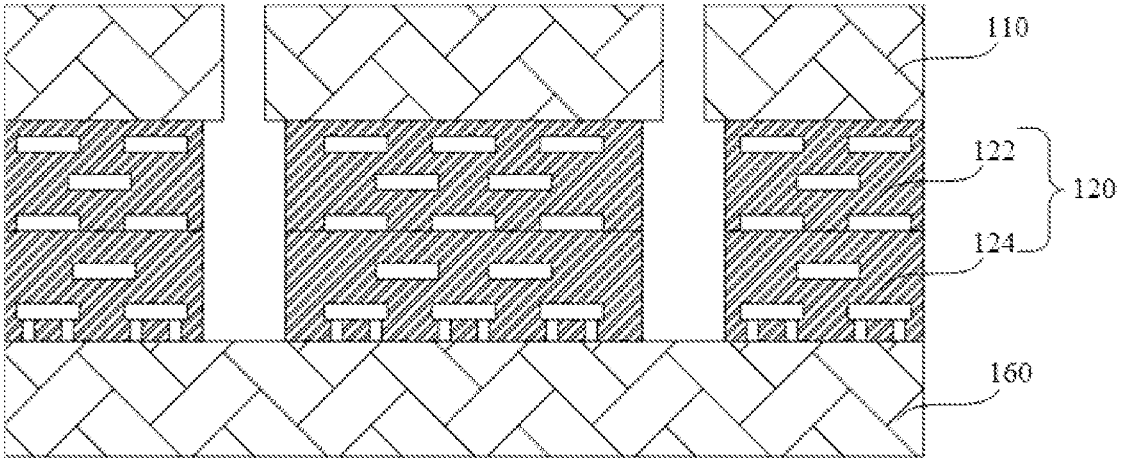
FIG. 14 is a schematic diagram showing a structure resulting from cutting through a support layer in a dicing method according to an embodiment of the present invention.

Subsequently, as shown in FIG. 14, the support layer 110 is cut through along the thickness of the dicing lanes 120*b* from the side of the support layer 110 (i.e., the top side in the orientation of FIG. 14), forming individual dies. The support layer 110 may be cut using a plasma dicing process. In alternative embodiments of this application, this may be achieved by means of blade dicing, laser grooving, laser stealth dicing or the like. Here, for ease of process implementation, the substrate has been flipped over so that the support layer 110 is located above the functional layer 120 (it will be readily recognized that "above" and "under" are relative terms, which are used herein for ease of description only and not intended to be limiting). Similarly, with the protective structure 160 protecting the bonding interface (i.e., the top surface of the functional layer 120), contamination of the bonding interface by particles produced in the process can be minimized or prevented, increasing the quality and reliability of the bonding interface. Openings formed as a result of cutting through the support layer 110 may be smaller than those resulting from the etching process for emptying the dicing lanes 120*b*. In this way, the support layer 110 can extend beyond the functional layer 120, resulting in the formation of first steps 1100 between the support layer 110 and the functional layer 120.

Figure 15:
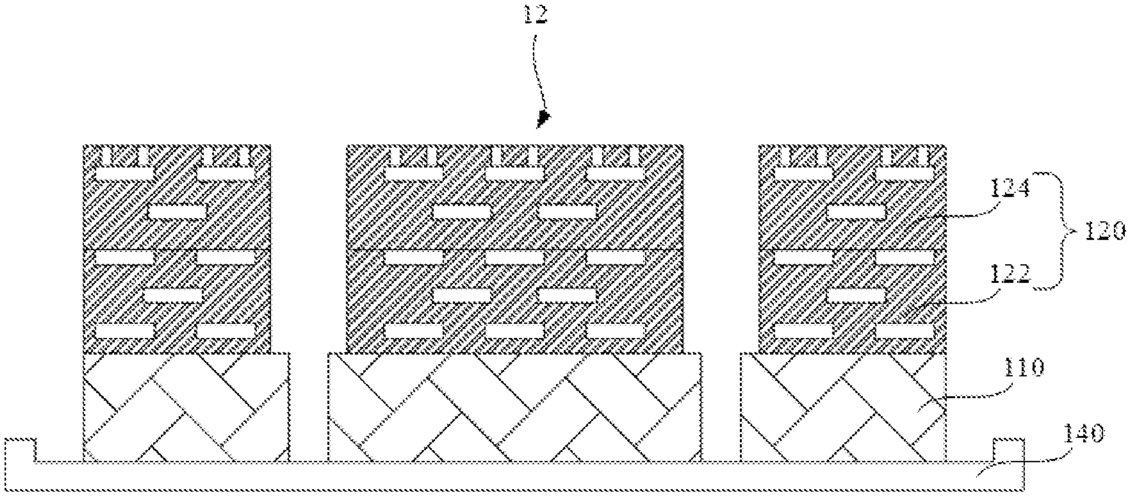
FIG. 15 is a schematic diagram showing a structure resulting from the removal of a protective structure in a dicing method according to an embodiment of the present invention.

After that, referring to FIG. 15, the protective structure 160 is removed, exposing the bonding interface and the first steps 1100. Thus, individual separate dies can be obtained. In the embodiments disclosed herein, the protective structure 160 may be removed by means of debonding. Before the protective structure 160 is removed, the support layer 110 may be arranged on a carrier 140 for retaining the diced substrate.

Once diced, each of the resulting dies may be bonded to another semiconductor structure. Reference can be made to the above description in connection with FIGS. 8 to 9 and Embodiment 1 for more details in this regard, and further description thereof is omitted herein.

Embodiment 4

Reference is now made to FIGS. 16 to 23, which are schematic illustrations of intermediate structures formed in a dicing method according to an embodiment of the present invention.

Figure 16:
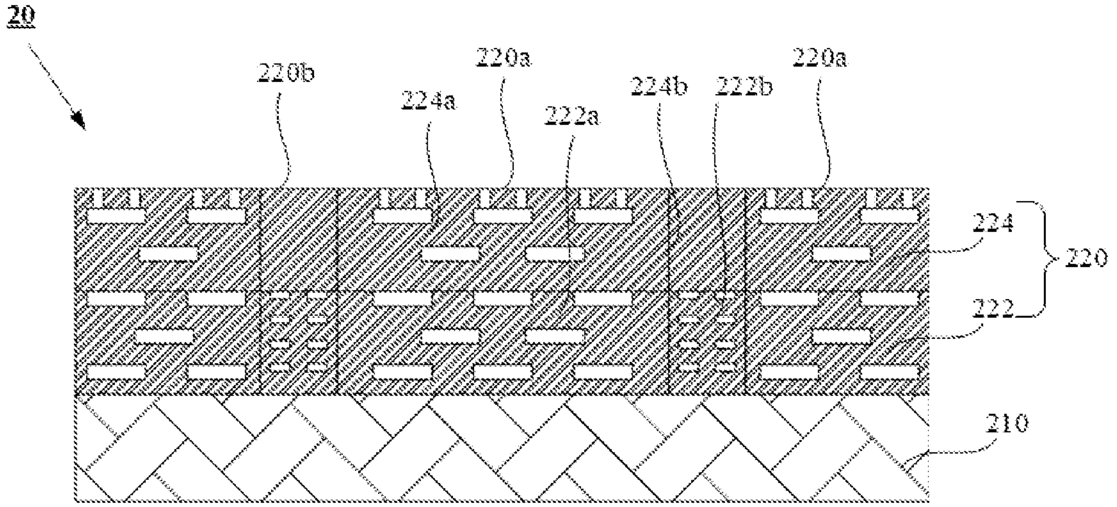
FIG. 16 is a schematic diagram showing the structure of a substrate provided in a dicing method according to an embodiment of the present invention taken perpendicular to a surface of the substrate.

As shown in FIG. 16, a substrate 20 is provided, which includes a support layer 210 and a functional layer 220 overlying the support layer 210. The functional layer 220 defines device regions 220*a* and dicing lanes 220*b*. Specifically, the dicing lanes 220*b* may include a plurality of dicing lanes 220*b* extending in a first direction and another plurality of dicing lanes 220*b* extending in a second direction, the second direction is perpendicular to the first direction in a cross-sectional plane parallel to a surface of the substrate 20. FIG. 16 schematically shows two of the dicing lanes 220*b* extending in the same direction. The dicing lanes extending in the first and second directions define a plurality of device regions 220*a* corresponding to a plurality of dies to be formed using the dicing process.

With continued reference to FIG. 16, in the embodiments disclosed herein, the support layer 210 may be a silicon substrate. The functional layer 220 includes a second functional sub-layer 222 and a first functional sub-layer 224, the second functional sub-layer 222 lies on the support layer 210 and is located in the same layer as second dicing lanes 222*b* and the first functional sub-layer 224 lies on the second functional sub-layer 222 and is located in the same layer as first dicing lanes 224*b*. In other embodiments, the functional layer 220 may be either a single layer or a composite layer consisting of two or more sub-layers. Accordingly, the second functional sub-layer 222 defines second device regions 222*a* and the second dicing lanes 222*b*, and the first functional sub-layer 224 defines first device regions 224*a* and the first dicing lanes 224*b*. Specifically, the second device regions 222*a* and/or the first device regions 224*a* may include a dielectric material (not shown) and/or a conductive material (not shown) within the dielectric material. These materials can impart different electrical functions. The second dicing lanes 222*b* and/or the first dicing lanes 224*b* may include a dielectric material and/or a conductive material within the dielectric material. Furthermore, the second functional sub-layer 222 and the first functional sub-layer 224 may be formed using the same or different processes on the same or different semiconductor equipment deployed at the same or different locations, without departing from the scope of the present application.

Figure 17:
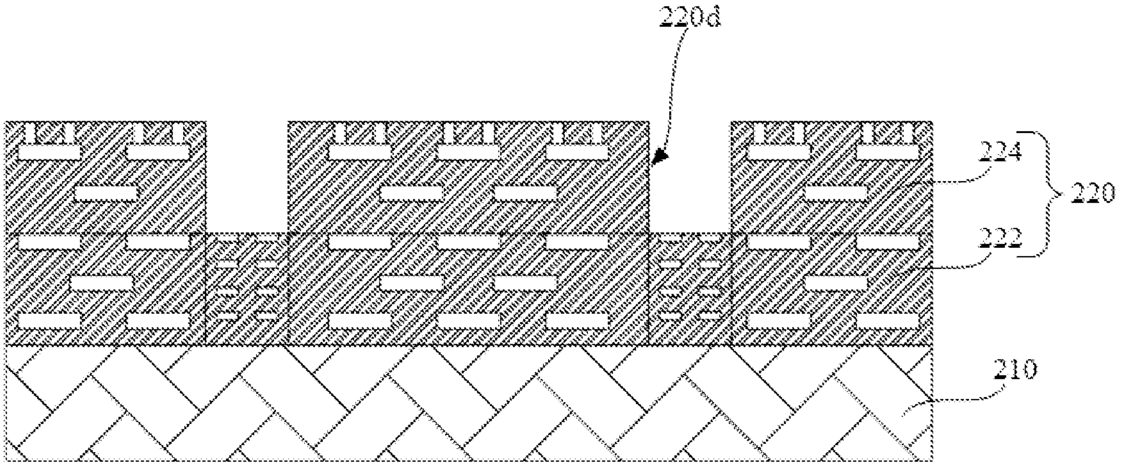
FIG. 17 is a schematic diagram showing a structure resulting from forming sub-openings by performing an etching process on dicing lanes in a dicing method according to an embodiment of the present invention.
Figure 18:
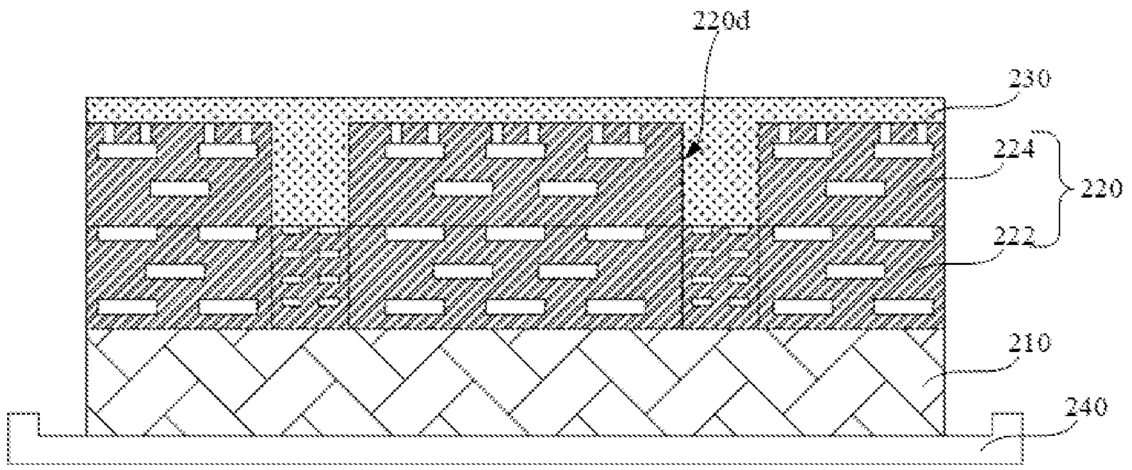
FIG. 18 is a schematic diagram showing a structure resulting from the formation of a protective structure in a dicing method according to an embodiment of the present invention.
Figure 19:
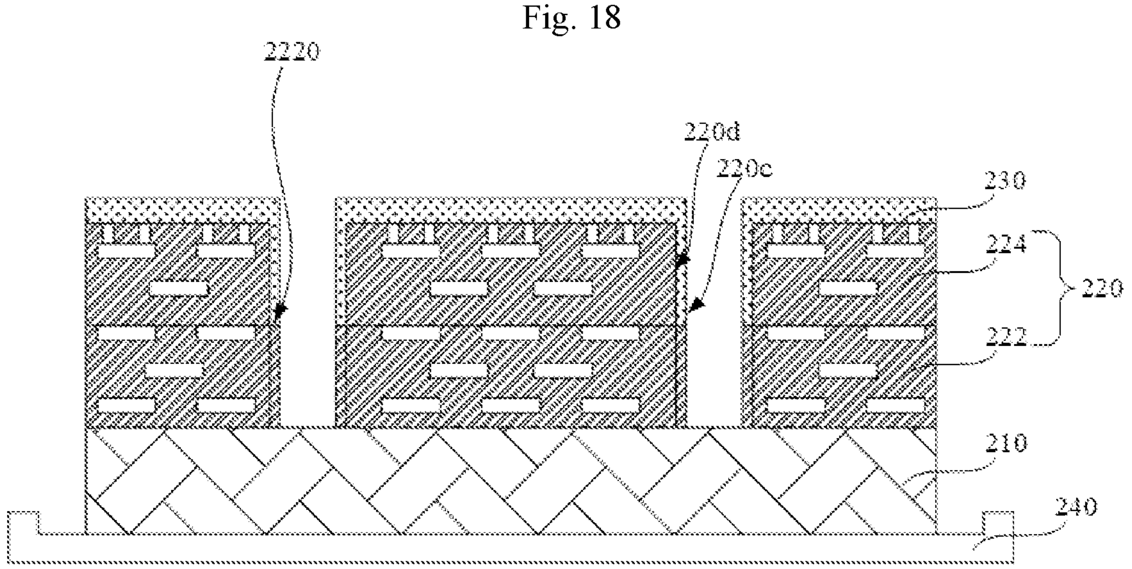
FIG. 19 is a schematic diagram showing a structure resulting from partially removing a protective structure in first dicing lanes and forming first openings through voiding second dicing lanes in a dicing method according to an embodiment of the present invention.

The first dicing lanes 224*b* extend from a top surface of the first functional sub-layer 224 to a bottom surface thereof, and the first dicing lanes 224*b* may contain a dielectric material only. The second dicing lanes 222*b* extend from a top surface of the second functional sub-layer 222 to a bottom surface thereof, and the second dicing lanes 222*b* may at least contain a dielectric material (not shown) and a conductive material (not shown) within the dielectric material. Next, referring to FIG. 19, the dicing lanes 220*b* define first openings 220*c*. Reference can be made to FIGS. 17 to 19 for details of the formation of the first openings.

Referring to FIG. 17, the first dicing lanes 224*b* are partially voided to form sub-openings 220*d* in the first dicing lanes 224*b*. Specially, a dry or wet etching process may be utilized to void the first dicing lanes 224*b* and thereby expose the second dicing lanes 222*b*. During the etching process for voiding the first dicing lanes 224*b*, substantially no particles are produced. Accordingly, in this process, even without the protection by a photoresist layer, particle contamination will substantially not occur to the exposed surface of the functional layer 220 (i.e., the bonding interface in the subsequent bonding process). Preferably, during the process for voiding the dicing lanes 220*b* and thereby forming the sub-openings 220*d*, the surface of the functional layer 220, especially of the device regions 220*a*, is covered with a photoresist layer, which can enhance protection for the functional layer 220. Of course, in alternative embodiments, blade dicing, laser grooving, laser stealth dicing or the like may be employed, without departing from the scope of this application.

As shown in FIG. 18, a protective structure 230 is formed, which covers the top surface of the functional layer 220, more precisely, of the device regions 220*a*, and fills the sub-openings 220*d*. Specifically, a protective fluid for use in laser dicing may be formed through a spin-coating process. In the embodiments disclosed herein, the substrate 20 is then attached to a carrier 240. Specifically, the support layer 210 may be attached to the carrier 240. This allows for easier retention of the subsequent separate individual dies.

Referring to FIG. 19, in the embodiments disclosed herein, the protective structure 230 within the sub-openings 220*d* is partially removed and the second dicing lanes 222*b* between the first dicing lanes 224*b* and the support layer 210 are partially emptied from the side of the protective structure 230, thereby partially exposing a surface of the support layer 210 and resulting in the formation of the first openings 220*c* which have a transverse dimension smaller than a transverse dimension of the sub-openings 220*d*. As a result, the protective structure 230 partially remains on side walls of the first dicing lanes 224*b*. The protective structure 230 remaining in the sub-openings 220*d* covers side walls of the first device regions 220*a*. Thus, as a result of the formation of the first openings 220*c*, the dielectric material and/or the conductive material partially remain(s) in the second dicing lanes 222*b*. In this way, the second functional sub-layer 222 extends beyond the first functional sub-layer 224. Therefore, second steps 2220 form between the first functional sub-layer 224 and the second functional sub-layer 222 after the substrate is diced.

Preferably, a laser grooving process may be utilized to partially remove the protective structure 230 in the sub-openings 220*d* and partially empty the second dicing lanes 222*b* between the first dicing lanes 224*b* and the support layer 210. With the protective structure 230 covering the top surface of the functional layer 220, i.e., protecting the bonding interface, contamination of the bonding interface will not happen even when a small amount of particles are produced.

Figure 20:
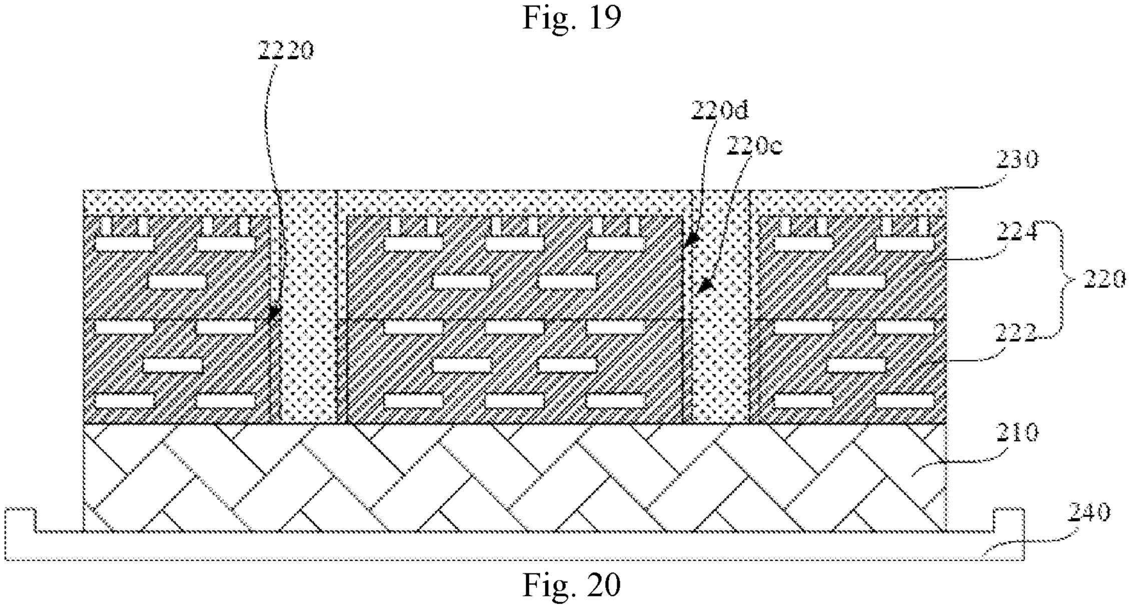
FIG. 20 is a schematic diagram showing a structure resulting from filling of dicing lanes in a dicing method according to an embodiment of the present invention.

Referring to FIG. 20, the first openings 220*c* are filled with the protective structure 230. That is, the protective fluid is filled into the first dicing lanes 224*b* and the second dicing lanes 222*b*. Similarly, it may be applied a spin-coating process may be utilized.

Figure 21:
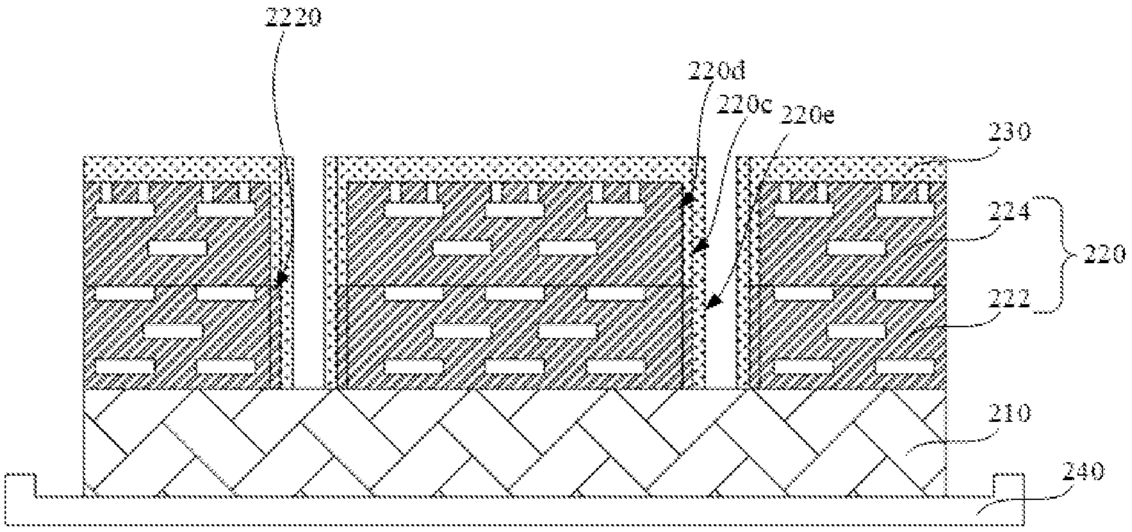
FIG. 21 is a schematic diagram showing a structure resulting from partial removal of a protective structure from dicing lanes in a dicing method according to an embodiment of the present invention.

Afterwards, referring to FIG. 21, the substrate 20 is placed on a carrier 240, and second openings 220*e* are formed in the first openings 220*c*. It is to be noted that the placement of the substrate 20 on the carrier 240 and the formation of the second openings 220*e* in the first openings 220*c* are not limited to being performed in any particular order. Preferably, the substrate 20 may be placed on the carrier 240 before the second openings 220*e* are formed in the first openings 220*c*. The formation of the second openings 220*e* may include partially removing the protective structure 230 in the first openings 220*c* so that the surface of the support layer 210 is partially exposed, resulting in the formation of the second openings 220*e*. In this way, the protective structure 230 partially remains in the dicing lanes 220*b* and covers side walls of the device regions 220*a*, and the second openings 220*e* have a transverse dimension smaller than that of the first openings 220*c*. In other words, in the embodiments disclosed herein, the protective structure 230 in the first dicing lanes 224*b* and the second dicing lanes 222*b* is partially removed, and the remainder of the protective structure 230 in the first dicing lanes 224*b* and the second dicing lanes 222*b* covers side walls of the functional layer 220, i.e., covers side walls of the second functional sub-layer 222 and the first functional sub-layer 224. Preferably, the protective structure 230 in the dicing lanes 220*b* is partially voided by means of laser grooving. The protective structure 230 may be formed of a protective fluid for use in laser dicing.

Subsequently, referring to FIG. 22, the support layer 210 between the second openings 220*e* and the carrier 240 is at least partially removed along the thickness of the dicing lanes 220*b* from the side of the protective structure 230. Specifically, in the embodiments disclosed herein, the support layer 210 exposed in the second openings 220*e* of the dicing lanes 220*b* is gradually cut until a surface of the underlying carrier 240 is exposed. Preferably, the support layer 210 is cut using a plasma dicing process. Likewise, with the protective structure 230 protecting the bonding interface, contamination of the bonding interface by particles produced in the process can be minimized or prevented, increasing the quality and reliability of the bonding interface. In alternative embodiments of this application, the support layer 210 may be cut by means of blade dicing, laser grooving, laser stealth dicing or the like.

Figure 23:
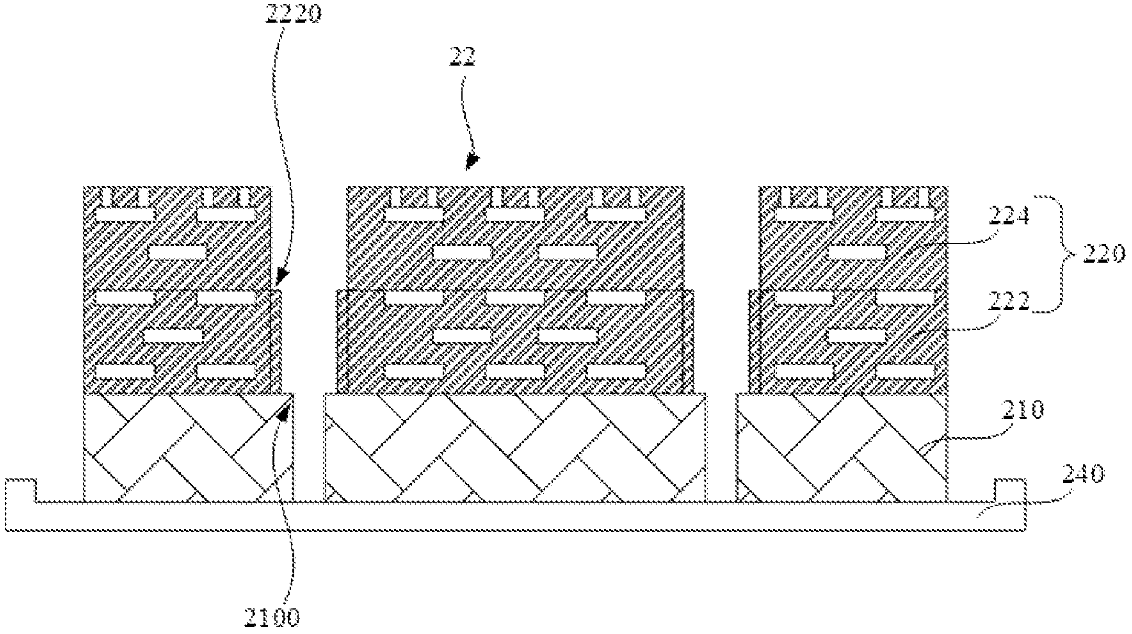
FIG. 23 is a schematic diagram showing a structure resulting from removal of a protective structure in a dicing method according to an embodiment of the present invention.

Since the part of the protective structure 230 that remains in the dicing lanes 220*b* covers the side walls of the functional layer 220, in the direction of the extension of the support layer 210, the support layer 210 extends beyond the functional layer 220. Therefore, first steps 2100 form between the support layer 210 and the functional layer 220. Thereafter, as shown in FIG. 23, the protective structure 230 is removed, exposing the bonding interface, the first steps 2100 and the second steps 2220. Specifically, a wet etching process may be employed to remove the protective structure 230. Additionally, the exposed surface may be cleaned to increase the quality and reliability of the separate dies.

With continued reference to FIG. 23, correspondingly, in embodiments of this application, there is also provided a die 22 including a support layer 210 and a functional layer 220 lying on the support layer 210. The functional layer 220 includes a device region 220*a*. A surface of the support layer 210 is partially exposed from the functional layer 220, and the support layer 210 and the functional layer 220 define first steps 2100 therebetween. The functional layer 220 includes a second functional sub-layer 222 on the support layer 210 and a first functional sub-layer 224 on the second functional sub-layer 222. A surface of the second functional sub-layer 222 is partially exposed from the first functional sub-layer 224. The first functional sub-layer 224 and the second functional sub-layer 222 define second steps 2220 therebetween.

Further, the die 22 may be bonded to another semiconductor structure, such as the semiconductor structure 14 shown in FIG. 9. Reference can be made to the above description in connection with the preceding Embodiments for more details in this regard, and further description thereof is omitted in herein.

Embodiment 5

Embodiment 5 differs from Embodiment 4 in that the support layer is diced in a different manner. In step S10, a substrate is provided, which includes a support layer and a functional layer lying on the support layer. The functional layer defines device regions and dicing lanes, and the dicing lanes define first openings. In step S11, a protective structure is formed, which at least covers a top surface of the functional layer. Reference can be made to the above description in connection with FIGS. 16 to 18 and Embodiment 4 for more details in this regard, and further description thereof is omitted in Embodiment 5. The substrate is diced along the thickness of the dicing lanes into individual separate dies. This may involve: from the side of the protective structure, partially removing the protective structure in the first dicing lanes and partially voiding the second dicing lanes so that the surface of the support layer is partially exposed; filling the second dicing lanes and the first dicing lanes with the protective structure, wherein the protective structure is formed of a protective fluid for use in laser dicing; and partially removing the protective fluid from the dicing lanes so that the surface of the support layer is partially exposed. Likewise, reference can be made to the above description in connection with FIGS. 19 to 21 and Embodiment 4 for more details in this regard, and further description thereof is omitted herein.

Figure 22:
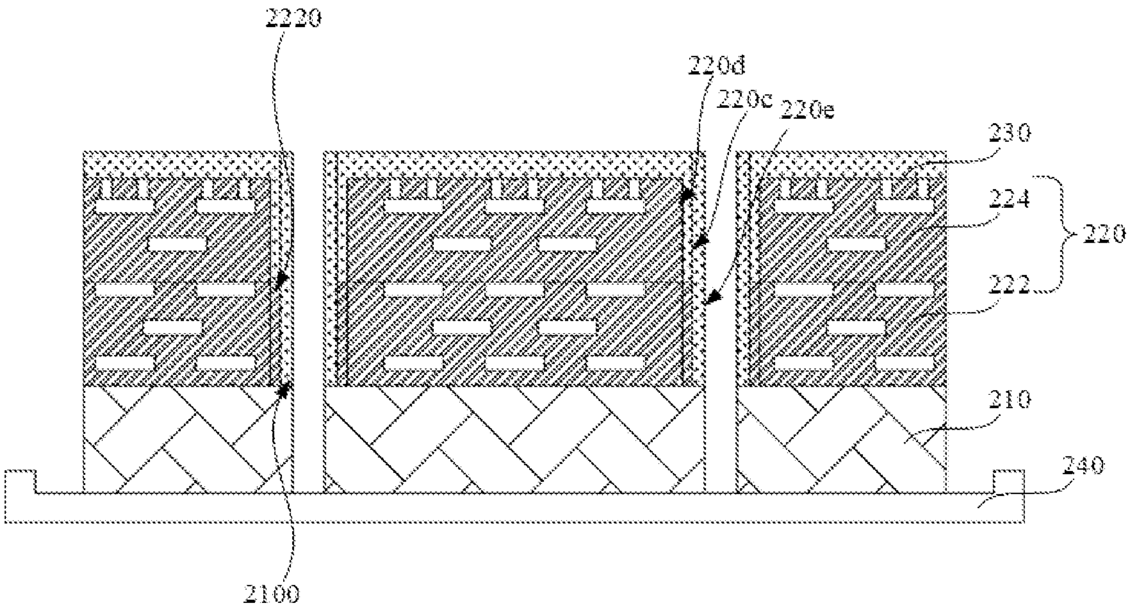
FIG. 22 is a schematic diagram showing a structure resulting from cutting through a support layer in a dicing method according to an embodiment of the present invention.

As shown in FIG. 21, after the protective structure 230 is partially removed from the dicing lanes 220*b* and the surface of the support layer 210 is partially exposed, a partial thickness of the support layer 210 is removed along the thickness of the dicing lanes 220*b* from the side of the protective structure 230, as shown in FIG. 22. That is, the removal may stop within the support layer, or proceed through the entire support layer 210 (i.e., dice the substrate 20 into individual dies). In the former case, grooves 250 will be formed in the support layer 210. These grooves 250 may have any cross-sectional shape taken perpendicular to the surface of the functional layer 220.

Figure 24:
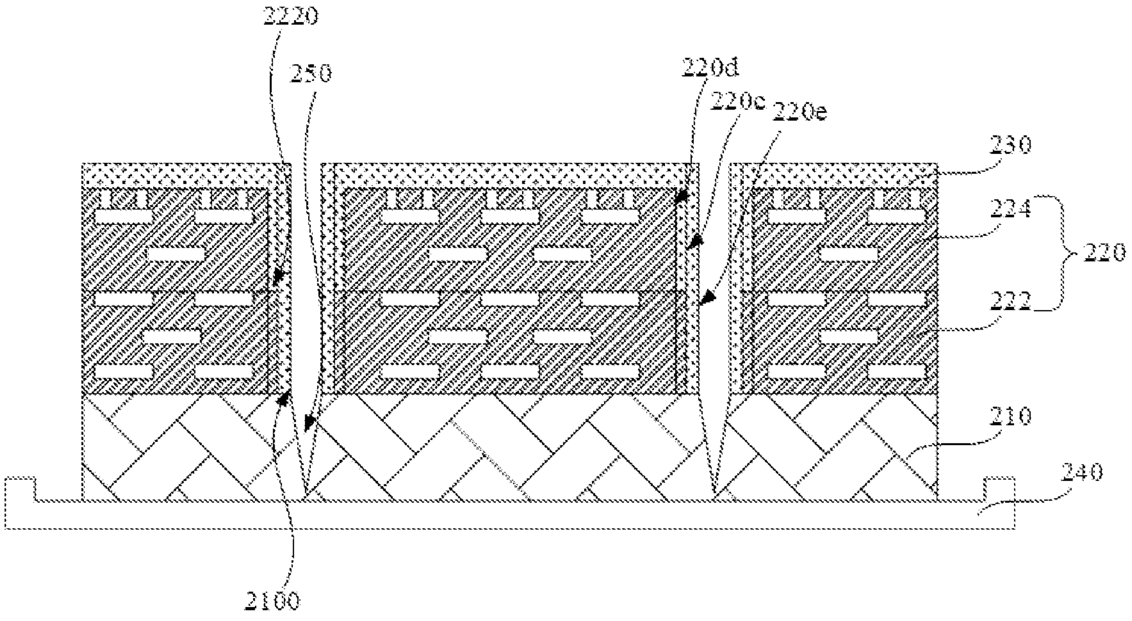
FIG. 24 is a schematic diagram showing a structure resulting from cutting a support layer in a dicing method according to an embodiment of the present invention.

As shown in FIG. 24, in the embodiments disclosed herein, a plasma dicing process may be employed to remove a partial thickness of the support layer 210, which may account for preferably 50% or more, and more preferably 80% to 95%, of a total thickness of the support layer 210. As illustrated, the grooves 250 are V-shaped grooves having slanted side walls and a sharp bottom.

Figure 25:
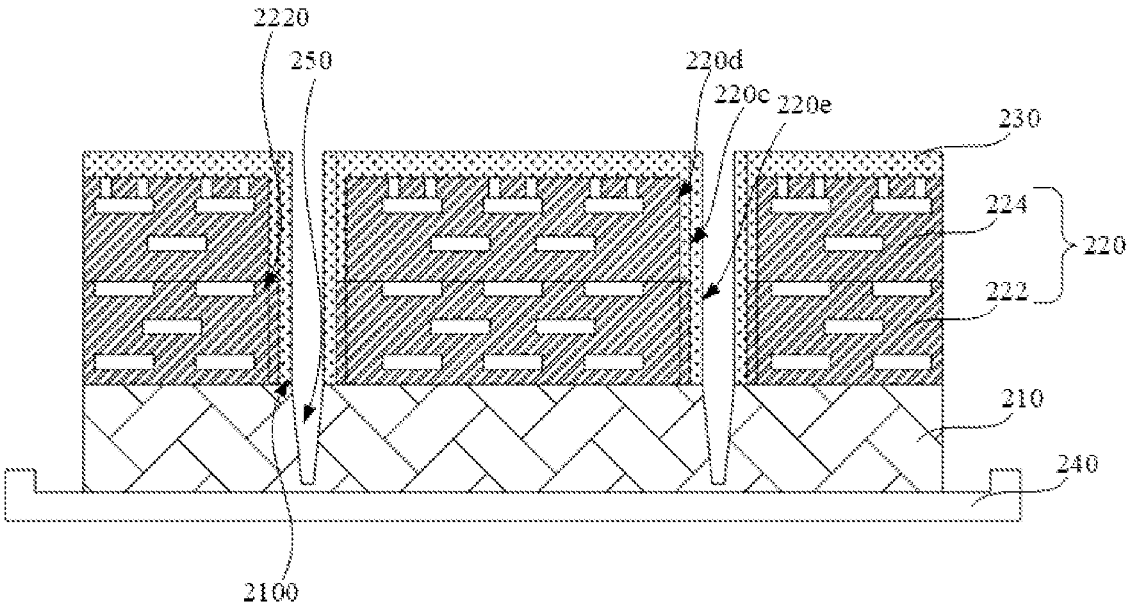
FIG. 25 is a schematic diagram showing a structure resulting from cutting a support layer in a dicing method according to another embodiment of the present invention.

Referring to FIG. 25, in an alternative embodiment of this application, a laser grooving process may be employed to remove a partial thickness of the support layer 210, which may account for preferably 50% or more, and more preferably 80% to 95%, of the total thickness of the support layer 210. In this case, the grooves 250 may be inverted trapezoid-shaped grooves having slanted side walls and a flat bottom, as well as an opening size greater than their bottom size.

Figure 26:
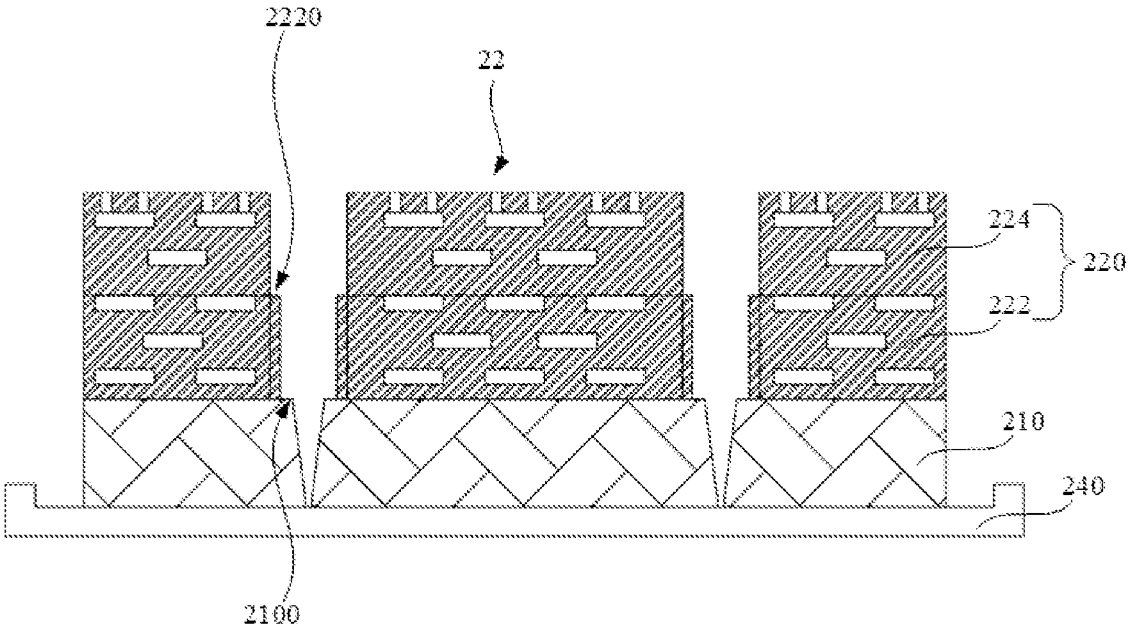
FIG. 26 is a schematic diagram showing a structure resulting from cutting through a support layer in a dicing method according to an embodiment of the present invention.

Referring to FIG. 26, the support layer 210 between the second openings 220*e* and the carrier 240 is then at least partially removed along the thickness from the side of the support layer 210, separating the substrate into individual dies. In the embodiments disclosed herein, the carrier 240 may be a dicing tape 240, and the support layer 210 may be attached to the dicing tape 240. In particular, the dicing tape 240 may be an adhesive tape. Specifically, the substrate may be diced into individual dies by breaking the support layer 210 along the grooves 250 with a pin and/or through stretching the carrier 240. Preferably, a pin may be used to poke the support layer 210 and thereby break it apart.

Likewise, with the protective structure 230 protecting the bonding interface, contamination of the bonding interface by particles can be minimized or prevented, increasing the quality and reliability of the bonding interface.

With continued reference to FIG. 26, the protective structure 230 is then removed, exposing the bonding interface, the first steps 2100 and the second steps 2220. Additionally, each of the resulting individual dies may be bonded to another semiconductor structure. Reference can be made to the above description in connection with the preceding Embodiments for more details in this regard, and further description thereof is omitted herein.

Embodiment 6

Embodiment 6 differs from Embodiment 4 in that the protective structure is a semiconductor substrate. In step S10, a substrate is provided, which includes a support layer and a functional layer lying on the support layer. The functional layer defines device regions and dicing lanes, and the dicing lanes define first openings. Reference can be made to the above description in connection with FIGS. 16 to 17 and Embodiment 4 for more details in this regard, and further description thereof is omitted in Embodiment 6.

Figure 27:
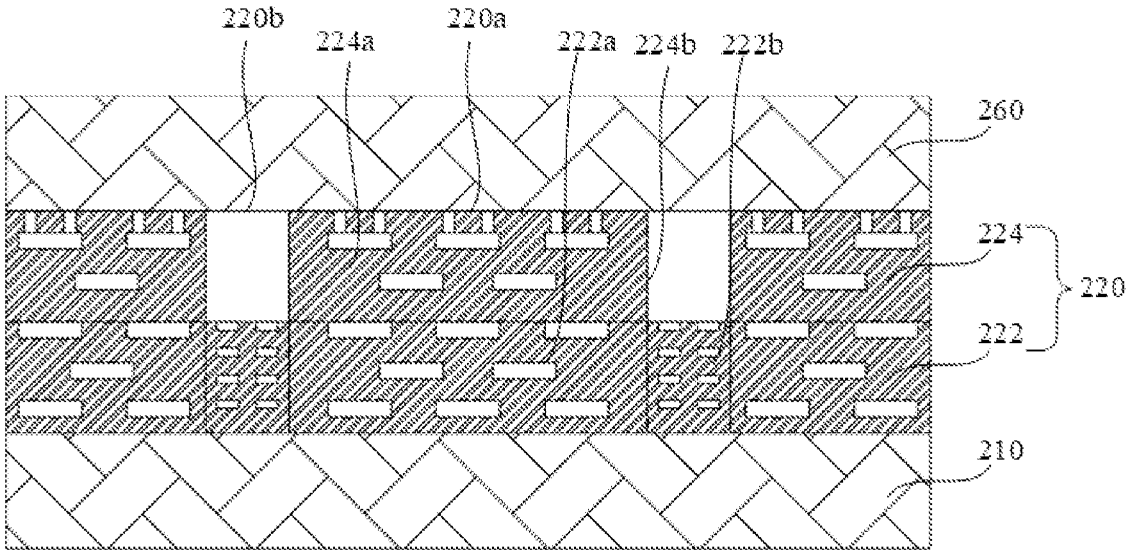
FIG. 27 is a schematic diagram showing a structure resulting from forming a protective structure in a dicing method according to an embodiment of the present invention.

As shown in FIG. 17, an etching process is performed on the dicing lanes 220*b*, thereby voiding the first dicing lanes 224*b* and forming sub-openings 220*d* in which the second dicing lanes 222*b* are exposed. Next, as shown in FIG. 27, a protective structure 260 is performed over the top surface of the functional layer 220. Here, the protective structure 260 is a semiconductor substrate. Specifically, the protective structure 260 may be formed on the functional layer 220 using a temporary bonding process.

Figure 28:
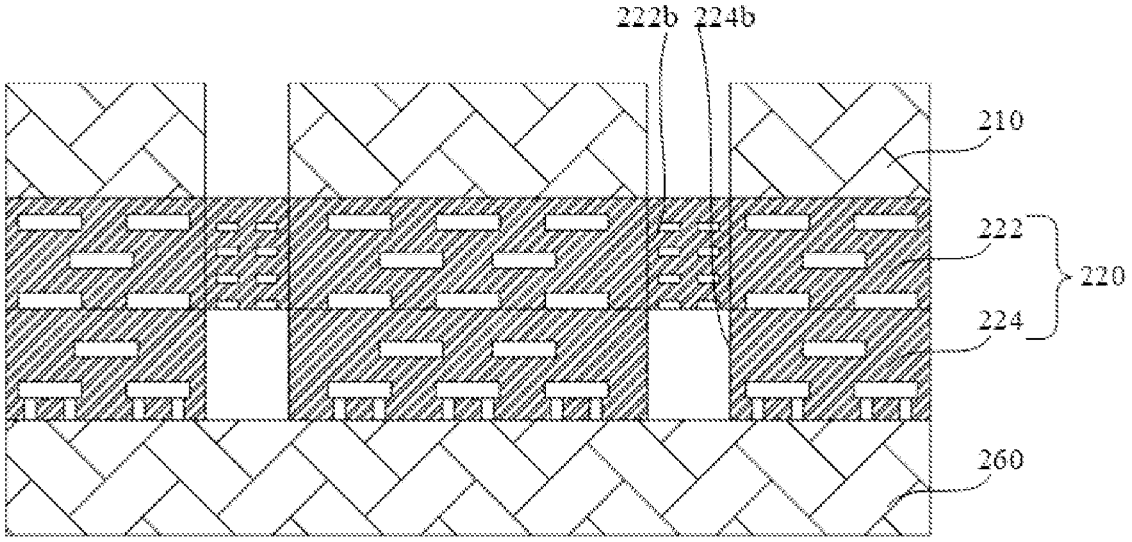
FIG. 28 is a schematic diagram showing a structure resulting from cutting through a support layer in a dicing method according to an embodiment of the present invention.

Subsequently, as shown in FIG. 28, the support layer 210 is cut through along the thickness of the dicing lanes 220*b* from the side of the support layer 210. The support layer 210 may be cut using a plasma dicing process. In alternative embodiments of this application, this may be achieved by means of blade dicing, laser grooving, laser stealth dicing or the like. Here, for ease of process implementation, the substrate has been flipped over so that the support layer 210 is located above the functional layer 220. Similarly, with the protective structure 260 protecting the bonding interface (i.e., the top surface of the functional layer 220), contamination of the bonding interface by particles produced in the process can be minimized or prevented, increasing the quality and reliability of the bonding interface.

Figure 29:
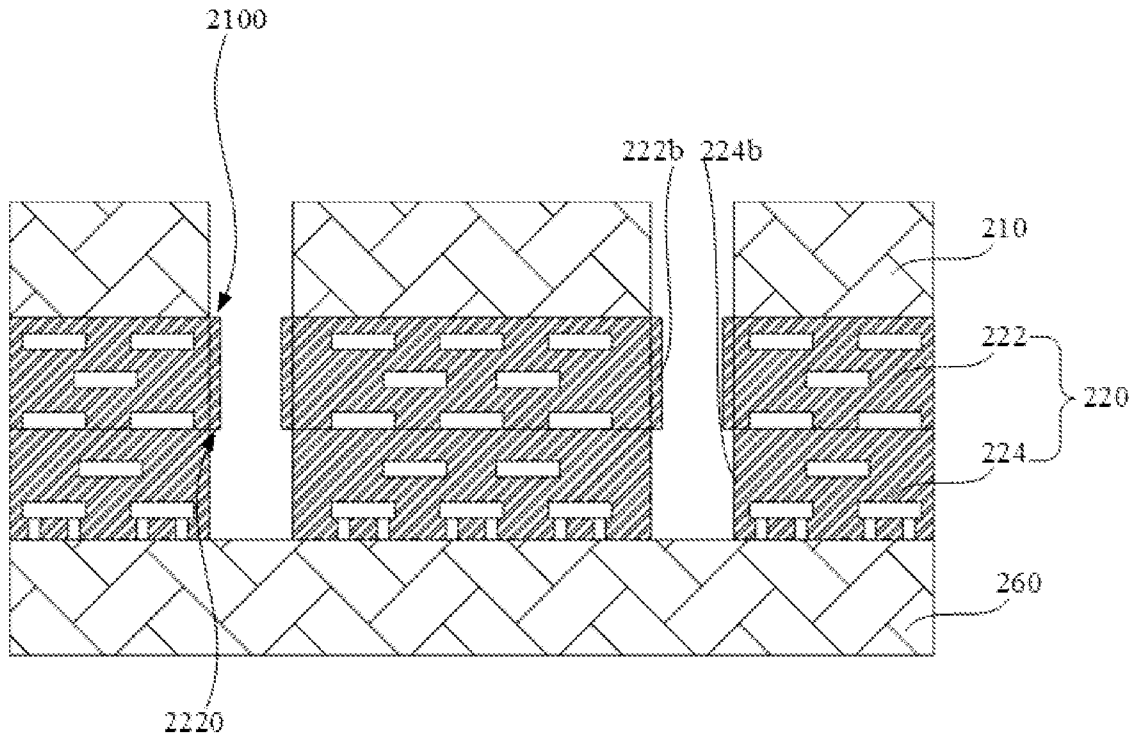
FIG. 29 is a schematic diagram showing a structure resulting from voiding second dicing lanes in a dicing method according to an embodiment of the present invention.

Referring to FIG. 29, the substrate is then diced along the second dicing lanes 222*b* from the side of the support layer 210 into individual dies. Preferably, this is accomplished by means of laser grooving.

In the embodiments disclosed herein, openings formed in the support layer 210 may be differently sized from those formed in the second dicing lanes 222*b*, resulting in the formation of first steps 2100 between the support layer 210 and the second dicing lanes 222*b*. For example, laser beams with different energy may be used to form the different sized openings. Additionally, openings formed in the first dicing lanes 224*b* may be also differently sized from those formed in the second dicing lanes 222*b*, resulting in the formation of second steps 2220 between the first support layer 224 and the second support layer 222.

Figure 30:
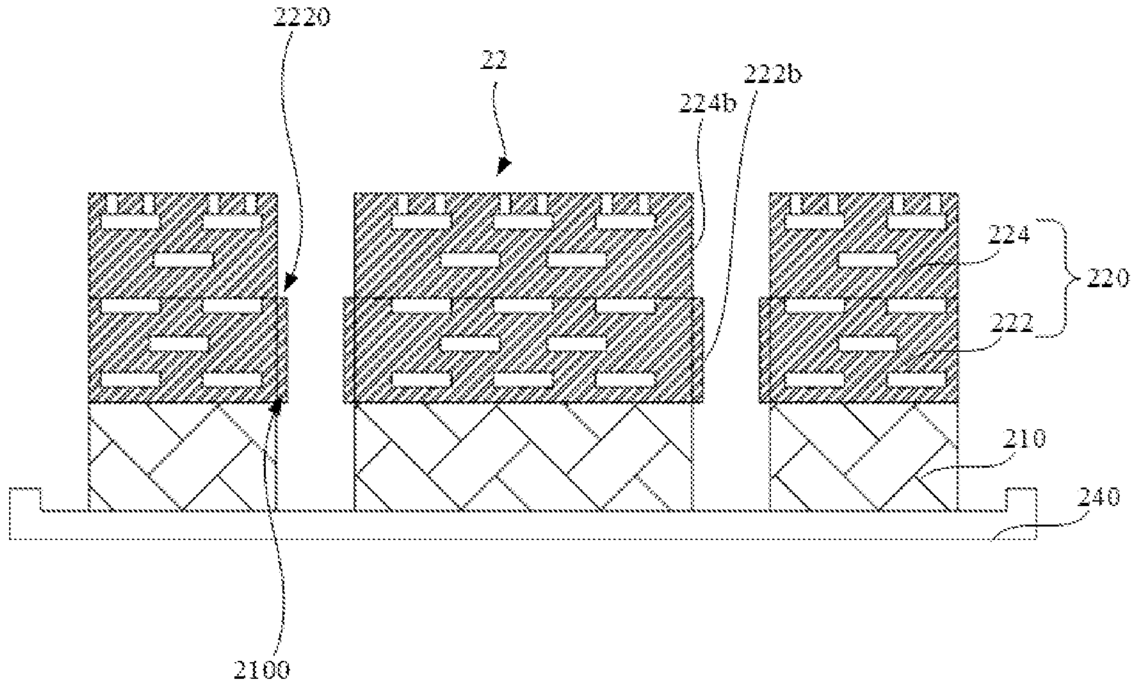
FIG. 30 is a schematic diagram showing a structure resulting from removing a protective structure in a dicing method according to an embodiment of the present invention.

After that, referring to FIG. 30, the protective structure 260 is removed, exposing the bonding interface, the first steps 2100 and the second steps 2220. Thus, individual separate dies can be obtained. In the embodiments disclosed herein, the protective structure 260 may be removed by means of debonding. Before the protective structure 260 is removed, the support layer 210 may be arranged on a carrier 240 for retaining the diced substrate. Once diced, each of the resulting dies may be bonded to another semiconductor structure. Reference can be made to the above description in connection with the foregoing Embodiments for more details in this regard, and further description thereof is omitted herein.

In summary, in the dicing method, the bonding method and the die provided in the present invention, after the protective structure at least covering the top surface of the functional layer is formed, the substrate is diced along the thickness of dicing lanes. With the protective structure protecting the top surface of the functional layer, contamination of the bonding interface by particles produced during the substrate dicing process can be minimized or prevented, increasing the quality and reliability of the bonding interface.

In other implementations of the present application, the features of the appended claims and the foregoing embodiments may be combined in different combinations to create new embodiments, which, however, will not be enumerated herein. In light of the above disclosure, those of ordinary skill in the art can make more variations without exerting any creative effort.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A dicing method, comprising:

providing a substrate comprising a support layer and a functional layer on the support layer, wherein the support layer is attached to a dicing tape, the functional layer having a side distal from the support layer serving as a bonding interface, the functional layer defining device regions and dicing lanes, the dicing lanes comprising first dicing lanes and second dicing lanes between the first dicing lanes and the support layer, the dicing lanes at least containing a dielectric material and a conductive material within the dielectric material, the dicing lanes defining first openings;

forming a protective structure at least covering a top surface of the functional layer;

dicing the substrate along a thickness of the dicing lanes; and removing the protective structure to expose the bonding interface, wherein the formation of the first openings comprises:

partially voiding the first dicing lane, thereby forming sub-openings in the first dicing lane;

filling the sub-openings with the protective structure; and partially removing the protective structure from the sub-openings and partially voiding the second dicing lane so that a surface of the support layer is partially exposed, thereby resulting in the formation of the first openings.

2. The dicing method of claim 1, wherein the functional layer and the support layer define first steps after the substrate is diced.

3. The dicing method of claim 1, wherein the formation of the first openings comprises performing an etching process on the dicing lanes to at least partially void the dicing lanes along the thickness so that the surface of the support layer is partially exposed.

4. The dicing method of claim 1, wherein the first openings have a transverse dimension smaller than a transverse dimension of the sub-openings.

5. The dicing method of claim 1, wherein a laser grooving process is utilized to partially remove the protective structure from the sub-openings and partially void the second dicing lanes.

6. The dicing method of claim 4, wherein the functional layer comprises a first functional sub-layer in the same layer as the first dicing lanes and a second functional sub-layer in a same layer as the second dicing lanes, wherein after the substrate is diced, the second functional sub-layer and the support layer define first steps, and the first functional sub-layer and the second functional sub-layer define second steps.

7. The dicing method of claim 1, wherein the protective structure is formed of a protective fluid for use in laser dicing.

8. The dicing method of claim 1, wherein the protective structure at least covering the top surface of the functional layer also fills the first openings, wherein the dicing method further comprises, before the substrate is diced along the thickness of the dicing lanes, providing the substrate on a carrier and forming second openings in the first openings, the formation of the second openings comprising partially removing the protective structure from the first openings so that the surface of the support layer is partially exposed, thereby resulting in the formation of the second openings, with a remainder of the protective structure in the first openings covering side walls of device regions, the second openings having a transverse dimension smaller than a transverse dimension of the first openings.

9. The dicing method of claim 1, wherein dicing the substrate along the thickness of the dicing lanes comprises:

removing at least a partial thickness of the support layer between the second openings and the carrier along the thickness of the dicing lanes from the side of the protective structure, the removal stopping within the support layer, thereby resulting in the formation of grooves in the support layer; and from a side of the support layer, dicing the substrate by breaking the support layer along the grooves with a pin and/or through stretching the carrier.

10. The dicing method of claim 1, wherein the substrate is a wafer, wherein the support layer is a silicon substrate, and wherein the substrate is diced into dies.

11. The dicing method of claim 1, wherein the protective structure at least covering the top surface of the functional layer is a semiconductor substrate, wherein dicing the substrate along the thickness of the dicing lanes comprises cutting through the support layer along the thickness of the dicing lanes from a side of the support layer, thereby dicing the substrate into individual dies; and the dicing method further comprises, after the substrate is diced along the thickness of the dicing lanes, removing the protective structure.

12. A die obtained according to the dicing method as defined in claim 1, the die comprising a support layer and a functional layer on the support layer, the functional layer comprising a device region, the functional layer and the support layer defining first steps.

13. The die of claim 12, wherein the functional layer comprises a second functional sub-layer on the support layer and a first functional sub-layer on the second functional sub-layer, the first functional sub-layer and the second functional sub-layer defining second steps.

14. A bonding method, comprising:

forming a die according to the dicing method as defined in claim 1; and bonding a functional layer of the die to a semiconductor structure, wherein the semiconductor structure is another substrate or another die.

15. The dicing method of claim 1, wherein dicing the substrate along the thickness of the dicing lanes comprises:

first cutting the functional layer along the thickness of the dicing lanes, and then cutting the support layer along the thickness of the dicing lanes.

16. The dicing method of claim 3, wherein the formation of the first openings comprises performing a non-mask etching process on the dicing lanes to remove the dielectric material and the conductive material in the dicing lanes.

17. The dicing method of claim 1, wherein during the formation of the first openings, molten slag generated by removing the conductive material in the dicing lanes adheres to the protective structure, and the protective structure is removed to take the molten slag away from the bonding interface.

18. The dicing method of claim 1, wherein during dicing the functional layer along the thickness of the dicing lanes, the bonding interface of the functional layer is spaced apart from the dicing tape.

19. The dicing method of claim 1, wherein the protective structure is formed of a liquid protective fluid, and the liquid protective fluid fills the first openings to cover side walls of the device regions.

20. The dicing method of claim 1, wherein the dicing tape is an adhesive tape, and wherein the dicing tape is supported on a rigid frame; and/or wherein the dicing tape comprises at least one of: a UV-release adhesive tape or a thermal-release adhesive tape.

* * * * *